(12) United States Patent
Sharrah et al.

(10) Patent No.: US 8,727,561 B2
(45) Date of Patent: May 20, 2014

(54) LIGHT AND/OR DEVICE HAVING A COMPARTMENT ACCOMMODATING BATTERIES OF DIFFERENT TYPES, SIZES AND/OR SHAPES

(75) Inventors: Raymond L. Sharrah, Collegeville, PA (US); Thomas D. Boris, Collegeville, PA (US); Brian Orme, Phoenixville, PA (US); Mark W. Snyder, Hockessin, DE (US)

(73) Assignee: Streamlight, Inc., Eagleville, PA (US)

( * ) Notice: Subject to any disclaimer, the term of this patent is extended or adjusted under 35 U.S.C. 154(b) by 97 days.

(21) Appl. No.: 13/050,498

(22) Filed: Mar. 17, 2011

(65) Prior Publication Data
US 2012/0236551 A1 Sep. 20, 2012

(51) Int. Cl.
*F21L 4/00* (2006.01)
*F21L 14/00* (2006.01)
*F21V 33/00* (2006.01)

(52) U.S. Cl.
USPC ........... 362/194; 362/184; 362/186; 362/197; 362/203

(58) Field of Classification Search
USPC .................... 320/110; 362/184, 183, 197, 203
See application file for complete search history.

(56) References Cited

U.S. PATENT DOCUMENTS

| | | | |
|---|---|---|---|
| 5,006,969 A * | 4/1991 | Lai | 362/206 |
| 5,167,447 A | 12/1992 | Gonzales | |
| 5,418,433 A | 5/1995 | Nilssen | |
| 6,046,572 A | 4/2000 | Matthews et al. | |
| 6,851,828 B1 | 2/2005 | Hansen | |
| 6,902,293 B2 | 6/2005 | Tang | |
| 6,942,359 B2 * | 9/2005 | Furth et al. | 362/205 |
| 7,221,125 B2 | 5/2007 | Ding | |
| D549,379 S | 8/2007 | Sharrah et al. | |
| 7,357,534 B2 | 4/2008 | Snyder | |
| 7,435,508 B2 | 10/2008 | Lee et al. | |
| 7,466,082 B1 | 12/2008 | Snyder et al. | |
| 7,549,766 B2 | 6/2009 | Sharrah et al. | |
| 7,581,847 B2 | 9/2009 | Dalton | |
| 7,651,239 B2 | 1/2010 | Spartano | |
| D611,629 S | 3/2010 | Sharrah et al. | |
| 7,780,309 B2 | 8/2010 | McMillan et al. | |
| 7,815,337 B2 * | 10/2010 | Grossman | 362/189 |
| 7,850,330 B2 | 12/2010 | Spartano et al. | |

(Continued)

OTHER PUBLICATIONS

International Searching Authority, "PCT International Search Report and Written Opinion—International Application No. PCT/US2012/028888", Jun. 28, 2012, 12 pages.

(Continued)

*Primary Examiner* — David J Makiya
(74) *Attorney, Agent, or Firm* — Clement A. Berard, Esq.; Dann, Dorfman, Herrell & Skillman, PC

(57) ABSTRACT

A portable light or device may comprise: a light source or operative element; a switch for controlling energization of the light source or operative element; and a housing supporting the light or operative element and the switch. The housing has a compartment having a relatively larger transverse dimension in one region for receiving a battery having a corresponding larger transverse dimension and has a relatively smaller transverse dimension at least at one end thereof for receiving a battery having a corresponding smaller transverse dimension. At least one electrical contact in the compartment is movable for making electrical connection to batteries having a relatively shorter length and a relatively longer length.

26 Claims, 13 Drawing Sheets

(56) References Cited

U.S. PATENT DOCUMENTS

| | | | |
|---|---|---|---|
| 7,909,478 B2 | 3/2011 | Dallas | |
| 7,959,317 B2 | 6/2011 | Spartano et al. | |
| 8,066,396 B2 | 11/2011 | Hunt | |
| 8,120,268 B2 | 2/2012 | Spartano et al. | |
| 8,356,910 B2* | 1/2013 | Messinger et al. | 362/183 |
| 8,548,633 B2 | 10/2013 | Adams et al. | |
| 8,562,169 B2 | 10/2013 | Kempter | |
| 2003/0077937 A1* | 4/2003 | Berg et al. | 439/500 |
| 2005/0122715 A1 | 6/2005 | Furth et al. | |
| 2007/0103114 A1 | 5/2007 | Hoffman | |
| 2007/0182368 A1 | 8/2007 | Yang | |
| 2007/0279902 A1* | 12/2007 | Kim | 362/202 |
| 2008/0068832 A1 | 3/2008 | Spartano et al. | |
| 2009/0040752 A1* | 2/2009 | Dallas | 362/202 |
| 2009/0135588 A1* | 5/2009 | Furth et al. | 362/157 |
| 2010/0142195 A1 | 6/2010 | Hoffman | |
| 2010/0301779 A1 | 12/2010 | Spartano et al. | |
| 2012/0132408 A1 | 5/2012 | Kempter | |
| 2012/0133205 A1 | 5/2012 | Adams et al. | |
| 2012/0136493 A1 | 5/2012 | Adams et al. | |
| 2012/0235593 A1 | 9/2012 | Snyder et al. | |

OTHER PUBLICATIONS

Texas Instruments, Inc., "TPS61020, TPS61024, TPS61025, TPS61026, TPS61027, TSP61028, TPS61029—96% Efficient Synchronous Boost Converter", SLVS451D, © 2003-2006, 27 pages.

Microchip Technology, Inc., "MCP1623/24—Low-Voltage Input Boost Regulator for Pico Microcontrollers", DS41420A, © 2010, 26 pages.

Microchip Technology, Inc., "PIC16F785 Data Sheet", DS41249A, © 2004, 178 pages.

\* cited by examiner

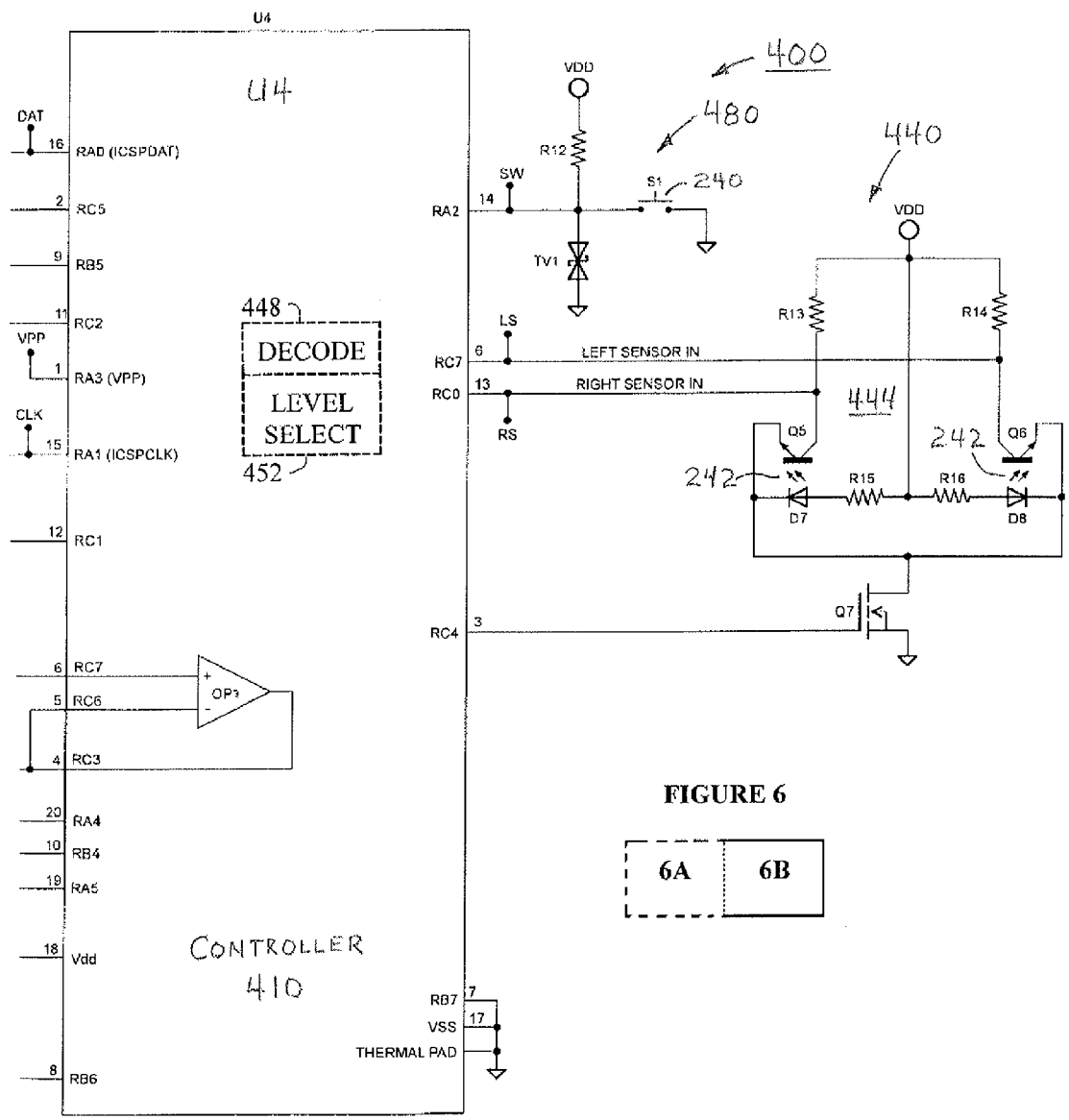
FIGURE 6

| 6A | 6B |
|----|----|

| 7A | 7B |

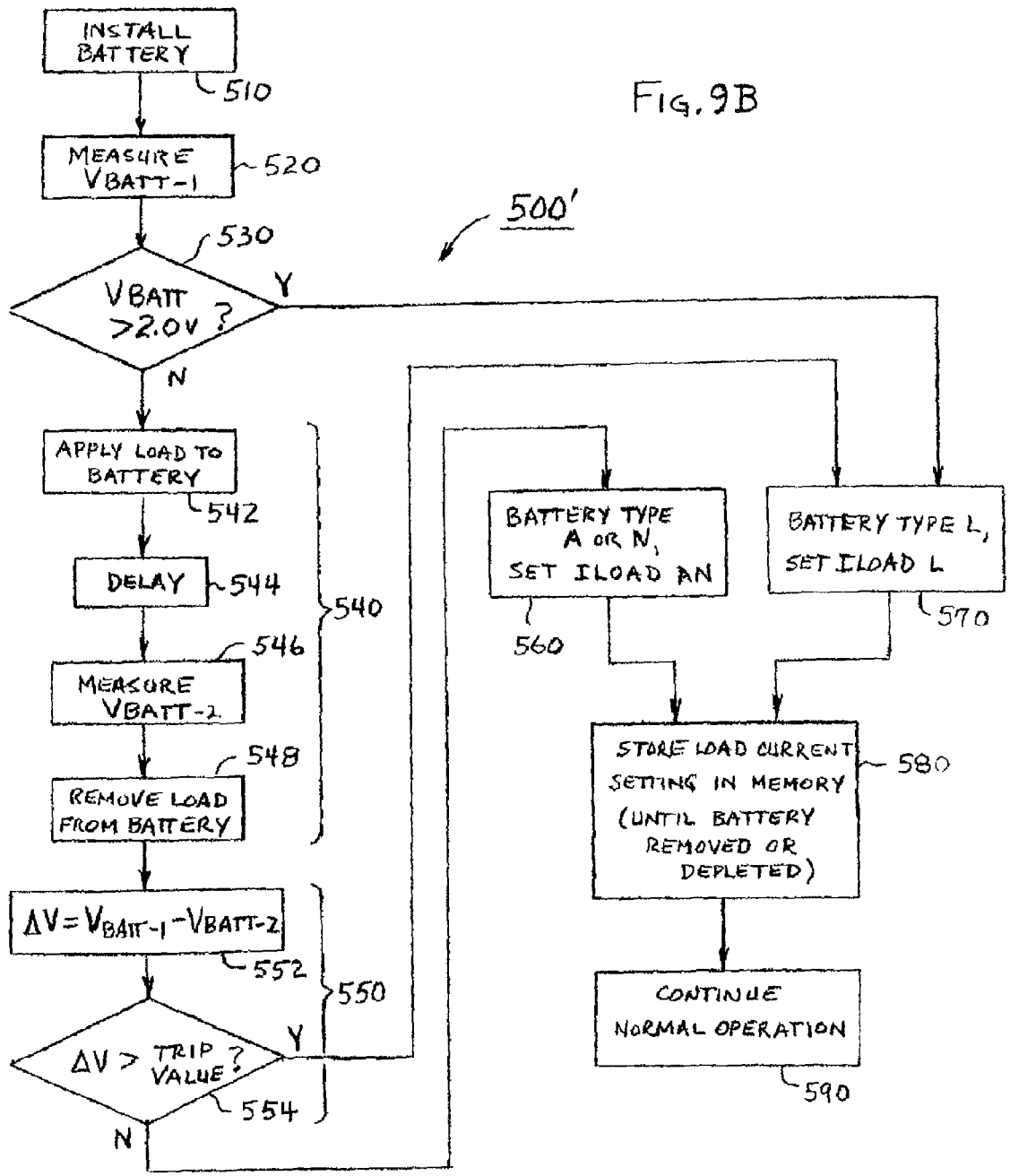

LIGHT AND/OR DEVICE HAVING A COMPARTMENT ACCOMMODATING BATTERIES OF DIFFERENT TYPES, SIZES AND/OR SHAPES

The present invention relates to a light and/or device and, in particular, to a light and/or device having a compartment that can accommodate batteries of different types, sizes and/or shapes.

Typical conventional portable lights operate by design from a particular type of battery which has a standardized size and shape, e.g., AA, AAA, C, D, CR123, CR2, and so forth. Conventional lights are also designed to accept a battery that has a defined standard chemistry, e.g., a carbon zinc, an alkaline, a lead acid, a NiCd, a NiMH, a lithium or a lithium-ion chemistry. When the time comes to replace the battery in a conventional light the operator must have a replacement battery of the particular size, shape and chemistry needed. This results in a need to have available batteries of the different sizes and shapes, and of the different chemistries, of the lights in use, or to simplify battery replacement by limiting the lights that will be utilized to those light that accept a particular replacement battery.

The foregoing is particularly disadvantageous, and may even be dangerous to life and limb, for lights that are employed in the field or in a remote location, and/or where it is desirable or even necessary to not be without an operating light. Examples include police, fire, military, hazardous materials, and other hazardous or fast response environments. Examples of lights suitable for such environments include the SIDEWINDER® light and the SIDEWINDER COMPACT® light both available from Streamlight, Inc. of Eagleville, Pa. which are described in U.S. Pat. No. 7,549,766 entitled "Light Including an Electro-Optical 'Photonic' Selector Switch," Des. 549,379 entitled "Portable Light" and Des. 611,629 entitled "Portable Light," each of which is hereby incorporated herein by reference in its entirety.

One approach taken to alleviate this battery replacement problem has been to provide lights that have separate battery compartments that can accept different batteries of the same chemistry, e.g., as in U.S. Pat. No. 5,167,447 entitled "Flashlight Using Different Size Batteries." Another approach has been to provide lights having battery compartments that have distinct sections or lobes for receiving batteries of different sizes, e.g. as in U.S. Pat. No. 6,851,828 entitled "Flashlight Utilizing Differently Sized Batteries" and U.S. Pat. No. 6,046,572 entitled "Battery Operated Appliance, Flashlight and Switching Systems." Each of these arrangements results in a light that is substantially larger than a light that accepts only one battery type due to the extra compartments and/or extra sections and/or lobes thereof that are needed to accept different battery sizes, shapes and/or types, and so tends to be disadvantageous for use in a miniature or compact light.

The foregoing problem is not limited to lights, but is inherent with devices that utilize replaceable batteries as a source of power. For example, battery operated night vision goggles and other night vision devices, such as are utilized by the military and police, battery operated testing devices for flammable and hazardous gasses and other hazardous materials, such as may be utilized by "haz-mat," utility and other emergency responders, would benefit from being able to be operated with batteries of different sizes, shapes and/or types as may be available in a given situation, rather than being limited to a single type of battery. Likewise, various medical devices could also benefit from being operable on different batteries.

Accordingly, Applicant believes there may be a need for a light and other devices that can accommodate in a battery compartment batteries of different sizes, shapes and/or types, without needing extra compartments or lobes that increase the size of the light.

A portable light or device may comprise: a light source or operative element; a switch for controlling energization of the light source or operative element; and a housing supporting the light source or operative element and the switch. A compartment of the housing may receive batteries of different sizes and has a relatively larger diameter in a central region and has a relatively smaller diameter at least at one end. Electrical contacts at opposite ends of the cylindrical compartment are for making electrical connection to a battery which may be of a relatively larger diameter and a relatively shorter length or may be of a relatively smaller diameter and a relatively longer length.

In another aspect, a portable light or device may comprise: a light source or operative element; a switch for controlling energization of the light source or operative element; and a housing supporting the light or operative element and the switch. The housing has a compartment having a relatively larger transverse dimension in one region for receiving a battery having a corresponding larger transverse dimension and has a relatively smaller transverse dimension at least at one end thereof for receiving a battery having a corresponding smaller transverse dimension. At least one electrical contact in the compartment is movable for making electrical connection to batteries having a relatively shorter length and a relatively longer length.

According to a further aspect, a light or device may comprise a housing having a compartment for receiving a battery therein and an electronic circuit responsive to a battery being placed in the compartment of the housing for determining the type of the battery and changing an operating condition of an operative element of the light or device responsive thereto

BRIEF DESCRIPTION OF THE DRAWING

The detailed description of the preferred embodiment(s) will be more easily and better understood when read in conjunction with the FIGURES of the Drawing which include.

Figure 1A:
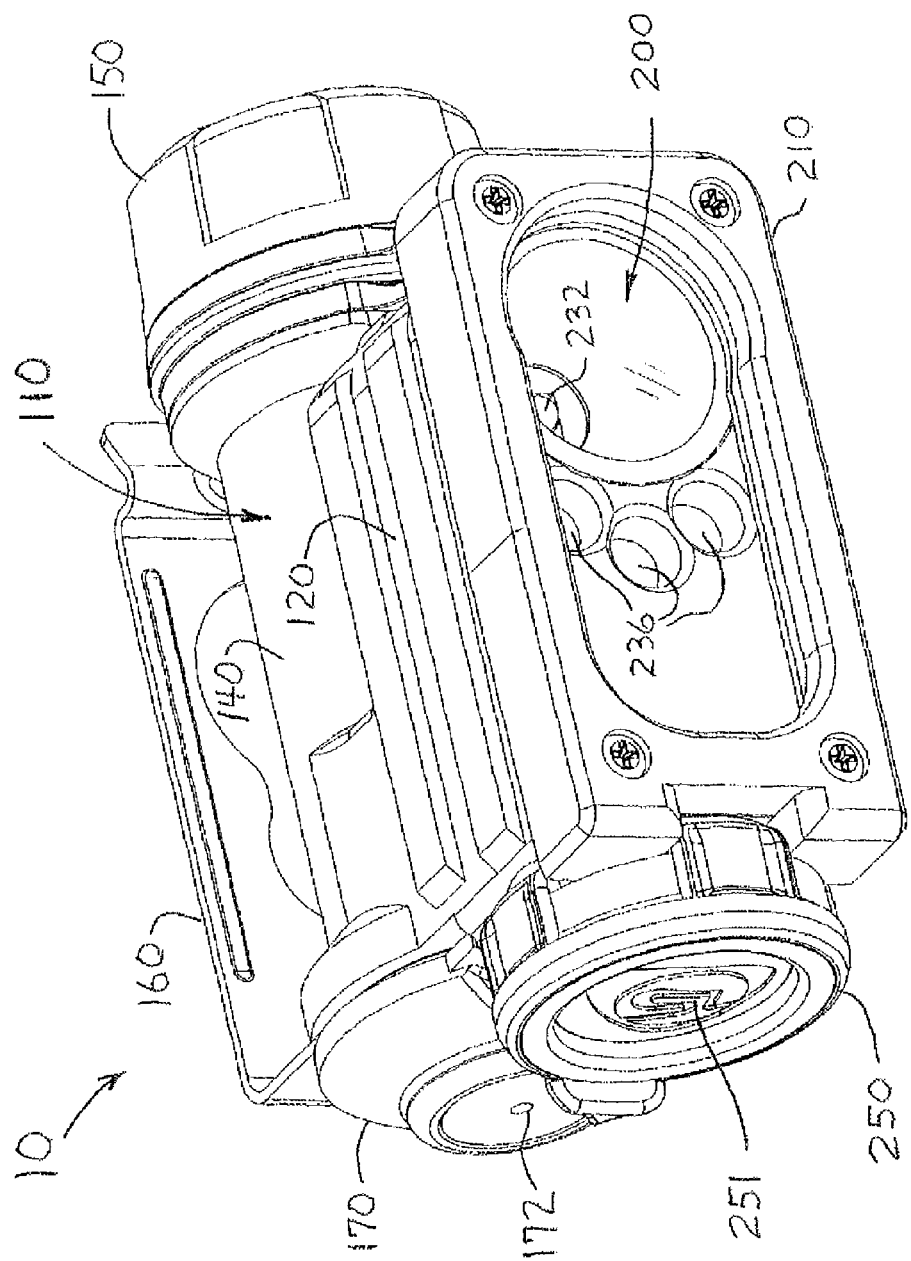
FIGS. 1A, 1B and 1C are perspective views of an example embodiment of a portable light of the present arrangement.

In the Drawing, where an element or feature is shown in more than one drawing figure, the same alphanumeric designation may be used to designate such element or feature in each figure, and where a closely related or modified element is shown in a figure, the same alphanumerical designation primed or designated "a" or "b" or the like may be used to designate the modified element or feature. Similarly, similar elements or features may be designated by like alphanumeric designations in different figures of the Drawing and with similar nomenclature in the specification. According to common practice, the various features of the drawing are not to scale, and the dimensions of the various features may be arbitrarily expanded or reduced for clarity, and any value stated in any Figure is given by way of example only.

DESCRIPTION OF THE PREFERRED EMBODIMENT(S)

Figure 1B:
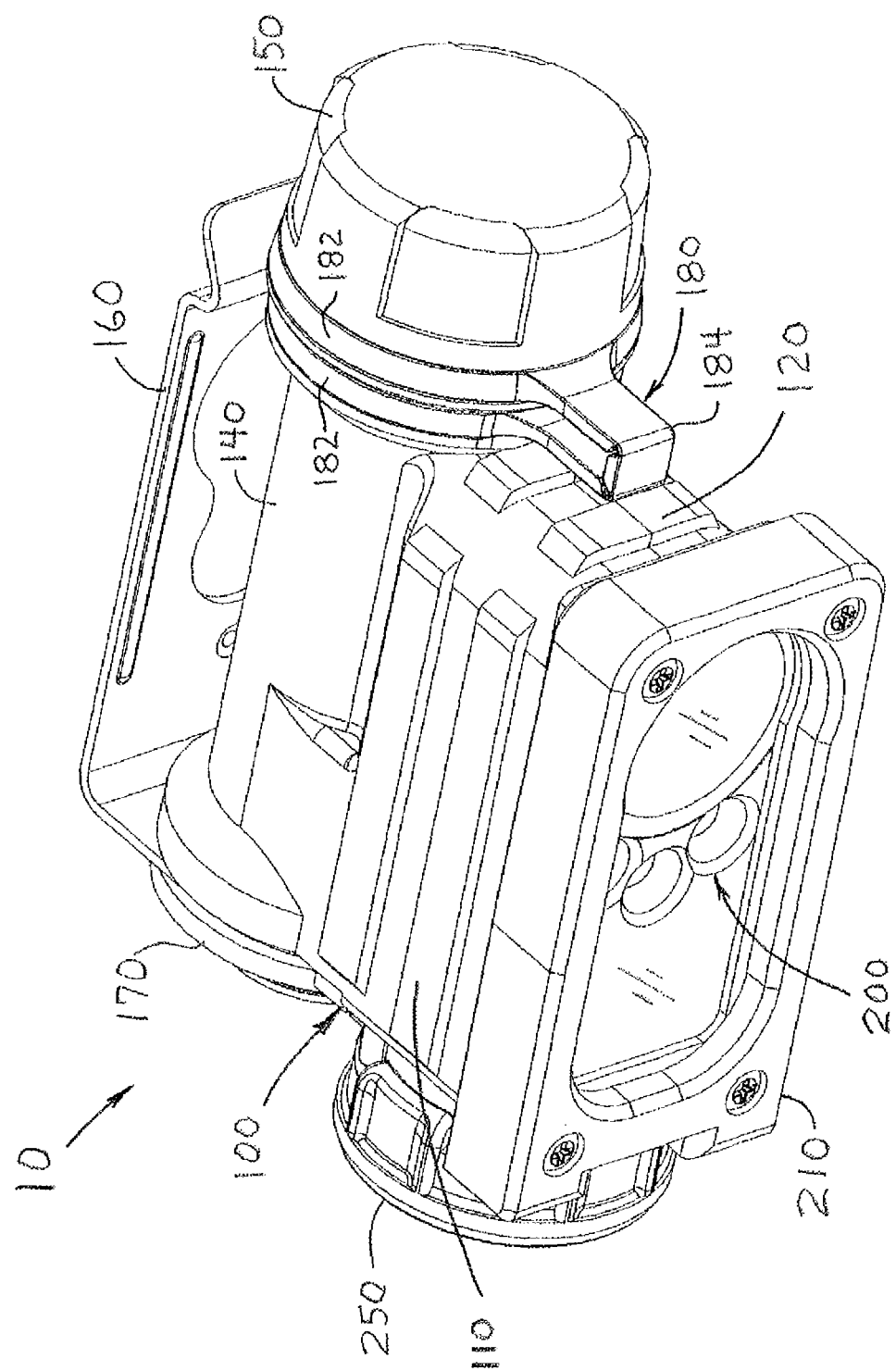
Figure 1C:
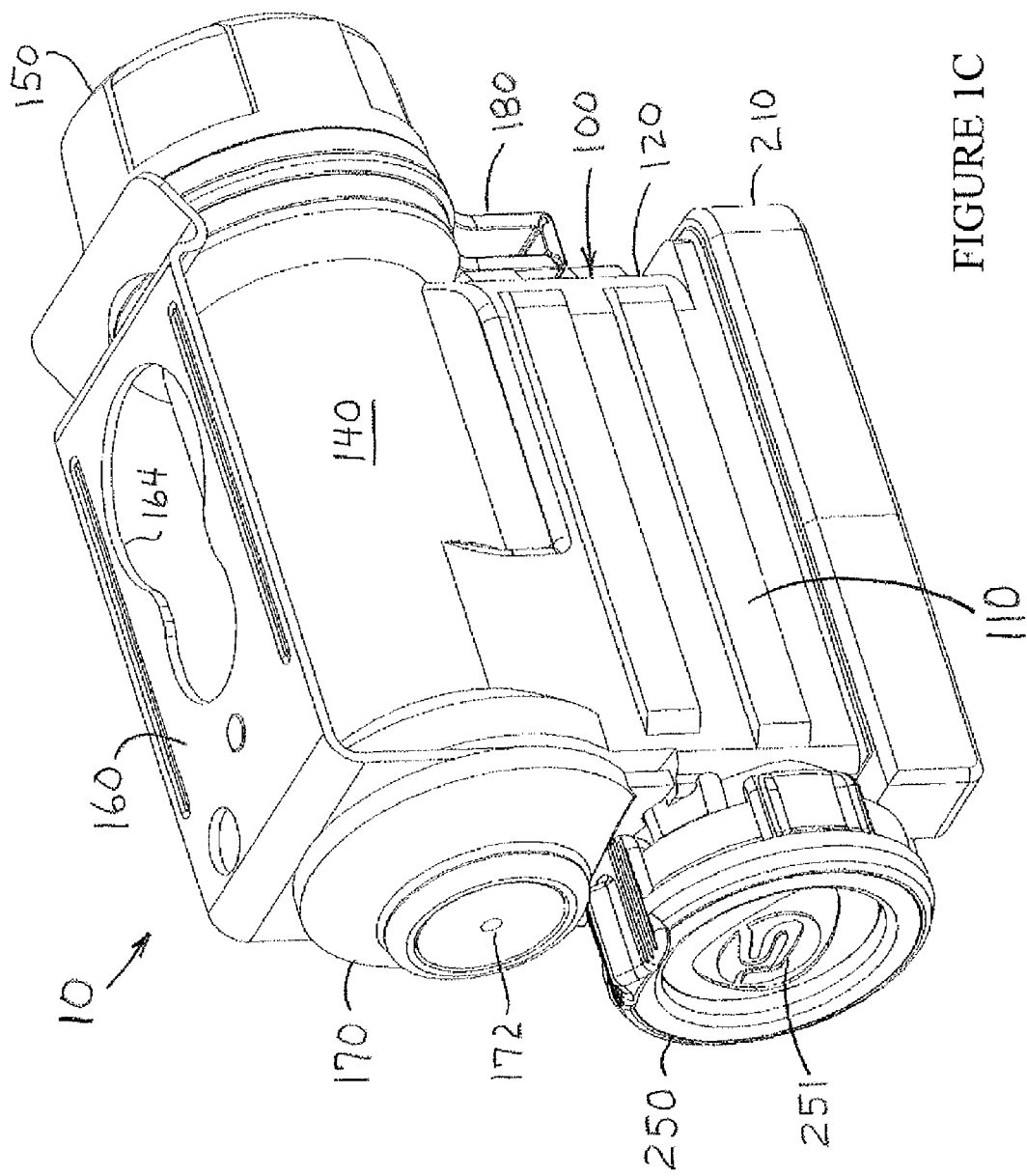

FIGS. 1A, 1B and 1C are perspective views of an example embodiment of a portable light 10 of the present arrangement. Light 10 comprises a light housing 100 having a housing portion 120 and a housing portion 140. Housing portion 120 may be generally rectangular and typically includes a light source assembly 200. Housing portion 120 resides adjacent a housing portion 140 which defines a generally cylindrical compartment therein for receiving batteries of different types therein. One example preferred light source assembly 200 includes a relatively higher light output light source 232 and one or more relatively lower light output light sources 236 which typically produce light having different properties, e.g. different colors and/or brightness.

A selector or knob 250 at one end of housing portion 120 is for selecting the one of light sources 230, 232, 236 that is to produce light when light 10 is turned ON and for turning light 10 ON and OFF. To that end, selector 250 preferably is rotatable to select the particular light source 230, 232, 236 to be operated by being pulled away from light body 100 against a spring bias, rotated to a desired operating position indicative of a selected light source 230, 232, 236, and then released to return toward body 100 by the spring bias. Selector knob 250 preferably has a central push button actuator 251 that may be pressed to cause the selected light source 230, 232, 236 to be turned ON and OFF, and further, preferably to select a particular operating mode, e.g., a brightness level, a continuous ON mode, a flashing mode, a blinking mode, and the like.

Body 100 typically has a tail cap 150 that covers the open end of its battery compartment 302, e.g., a compartment within housing portion 140, and may have a clip 160 by which light 10 may be attached to a person, an article and/or an object. Cap 150 may be tethered to housing portion 140 by a flexible connection 180 or tether 180 that allows cap 150 to be rotated relative to body 100. Clip 160 is preferably retained to body 100 by a clip cover 170 so as to be rotatable relative to body 100, whereby light produced by light 10 may be directed over a range of angular directions when light 10 is attached by clip 160. Cover 170 may include a vent port 172 for venting any pressure that might build up within body 100.

Figure 2:
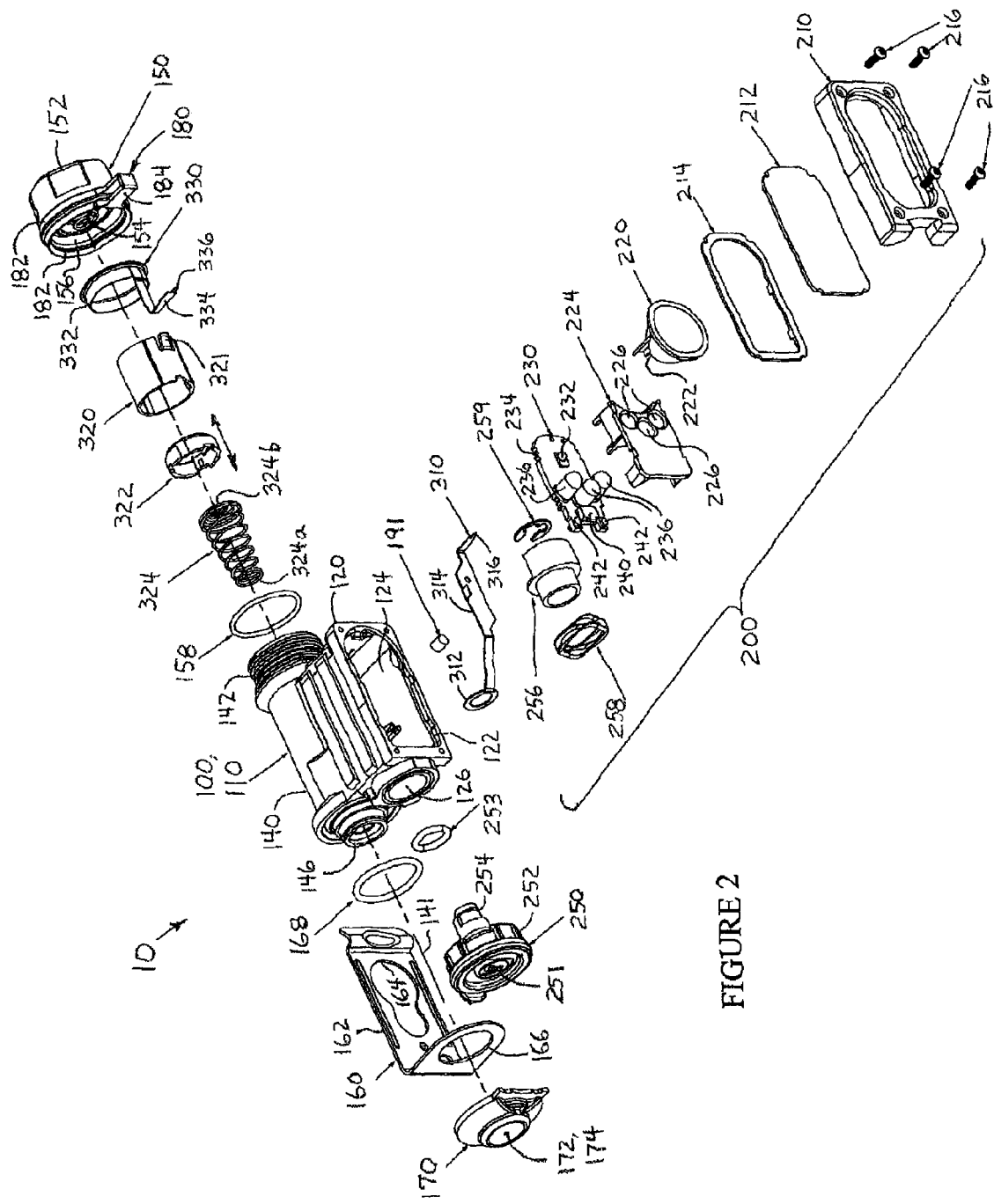
FIG. 2 is an exploded view of the example portable light of FIG. 1.
Figure 3:
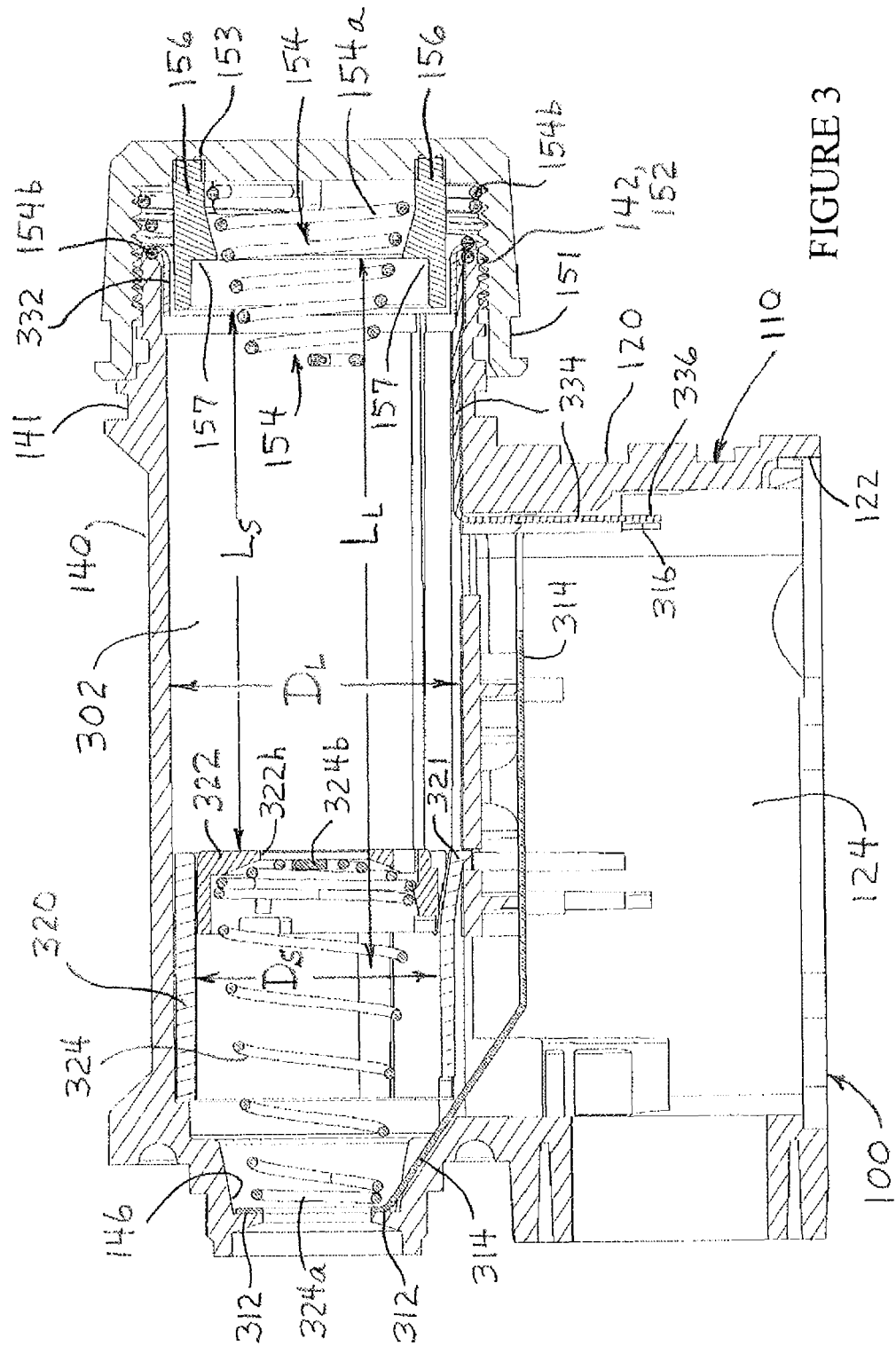
FIG. 3 is a cross-sectional view of the example light.

FIG. 2 is an exploded view of the example portable light 10 of FIG. 1 and FIG. 3 is a cross-sectional view thereof. Body 100 portion 120 has a generally rectangular opening 122 to an internal cavity 124 for receiving light source assembly 200 therein. Light source assembly 200 is retained in body portion 120 by a generally rectangular face cap 210 and lens 212 which may be sealed by a lens gasket 214. Face cap or bezel 210 is retained on body portion 120 by plural fasteners 216, e.g., screws 216, but may be retained by any suitable fastening.

Light source assembly 200 further includes a light source 230 which includes an electronic circuit board 234 on which are mounted various electronic components including, but not limited to, a first light source 232, e.g., a light emitting diode (LED) 232, one or more second type light sources 236, e.g., plural LEDs 236, and switch 240 which responds to actuation of actuator 251 of selector 250 for controlling operation of light source 230. Reflector 220 typically has a curved shaped reflective surface and resides adjacent light source 232 which resides at an opening 222 at the rear or narrow end of reflector 220. Reflector 220 may include a lens and/or protective cover 212 over light source 232. Panel 224 resides adjacent circuit board 234 and provides openings for light sources 236, and also serves to block external light from impinging upon optical components 242 located on circuit board 234.

Housing portion 120 also has an opening 126 at an end thereof for receiving selector 250 therein. Selector 250 includes a ring portion 252 for being rotated for selecting the light source 232, 236 that can be energized and/or controlled by actuating actuator 251 to operate switch 240. Central shaft 253 of selector 250 extends through opening 126 into sensor shroud 254 or baffle 254 which is secured thereon by E-ring 259 or other fastener. Spring 258, e.g., a wave spring 258, resides in compression between a shoulder of shroud 254 and the inner surface of housing portion 120 for biasing shroud 254 and selector 250 toward housing 120.

Selector 250 is rotatable relative to body 100, e.g., relative to portion 120 of housing 110, and typically has a number of selecting positions corresponding to the number of light sources 232, 236 of light source 230. Where light source 230 has four light sources 232, 236, selector 250 has four selection positions. Selector 250 is rotated from one selection position to another by pulling selector ring 252 away from body 100 against the bias of spring 258, rotating selector ring 252 to a desired position, and releasing selector ring 252 which is pulled toward body 100 housing 110 by spring 258.

Shroud 254 rotates with selector ring 252 as part of selector 250 and presents surfaces of different optical reflectivity to electro-optical components 242 at each of its positions, i.e four positions where selector 250 has four positions for selecting ones of the four light sources 232, 236. Electro-optical components 242 may include, e.g., two photo-emitter—photo-detector pairs that produce light that is either more strongly reflected or is less strongly or not reflected by the surfaces of shroud 254 creating four unique conditions for light from the photo-emitters 242 impinging upon their respective photo-detectors 242, from which the position of selector 250 can be detected from the outputs from photo-detectors 242. The outputs from photo-detectors 242 are decoded for the circuitry of light source 230 selecting the one of light sources 232, 236 that is selectively energizable by actuator 251 and switch 240. Selector 250 may be sealed by an O-ring 253.

Selector 250 and its associated circuitry may be, e.g., similar to the selector arrangement and its operation described in U.S. Pat. No. 7,549,766 entitled "Light Including an Electro-Optical 'Photonic' Selector Switch."

Portion 140 of housing 110 has an interior compartment for receiving a battery or batteries therein, which battery or batteries may be of different types, sizes and/or shapes. The battery compartment elements 300 of light 10 that are disposed in the battery compartment 302 of housing portion 110 and in cap 150 are described below. One end of housing portion 140 has a threaded end 142 through which a battery or batteries may be placed into and removed from housing 110, which end 142 is closed or covered by a cap or tail cap 150. Cap 150 includes a cap housing 152 and may have an optional tether 180 associated therewith and may be sealed by an O-ring 158. Optional tether 180 typically comprises two rings 182 joined by a tethering link 184. When one ring 182 is disposed in an external grove 141 near housing end 142 and the other ring 182 is disposed in an external groove 151 of cap housing 152, cap 150 and housing 110 are connected by tether 180 whereby cap 150 is not easily lost or misplaced when unscrewed from threaded end 142 of housing 110. Preferably, rings 182 are sized to move relatively freely within groves 141, 151, so that cap 150 may easily be removed and installed.

The other end of housing portion 150 has a seat 146 thereat the external portion of which is for receiving a cover 170 thereon. Cover 170 and seat 146 when assembled provide a groove therebetween in which mounting ring 166 of clip 160 is disposed with an O-ring 168, thereby to provide a mounting for clip 160 on light body 100, whereby clip 160 may swivel about housing portion 140, e.g., about central axis 141 thereof. O-ring 168 may provide a seal and may provide a friction with mounting ring 166 for retaining clip 160 in a position to which it is swivelled. Cover 170 may be retained on seat 146 by, e.g., an ultrasonic, thermal or chemical weld, by an adhesive or by any other suitable fastener. Cover 170 may have a vent 172 therein for releasing pressure that may build up within housing 110.

Battery compartment elements 300 are disposed within the battery compartment 302 of light body 100 for providing electrical connections for a battery or batteries of different shapes and sizes therein and for positioning the battery or batteries of different shapes and sizes in respective predetermined positions therein. Referring again to FIGS. 2 and 3, battery contacts 324, 154 are located at opposite ends of battery compartment 302 for making electrical contact with the terminals at the respective ends of a battery or batteries that may be placed into battery compartment 302. Contacts 324, 154 are preferably spring contacts, however, other types of contacts may be employed. While contacts 324, 154 may be configured for accepting a battery or batteries being placed in compartment 302 with either positive end in or negative end in, it is preferred that the battery or batteries be placed with positive end in. Thus, battery contact 324 preferably provides an electrical connection for the terminal at the positive end of the battery or batteries and battery contact 154 preferably provides an electrical connection for the terminal at the negative end of the battery or batteries.

Battery compartment 302 has a diameter $D_L$ which is compatible with the relatively larger diameter of one of the types of cylindrical battery or batteries intended to be placed therein, and accommodates batteries having a range of lengths from a relatively shorter length $L_S$ to a relatively longer length $L_L$. A tubular sleeve 320 is disposed coaxially at the bottom of compartment 302 so as to provide a reduced diameter portion or section thereat having a relatively smaller diameter $D_S$ which is compatible with the relatively smaller diameter of another of the types of cylindrical battery or batteries intended to be placed therein. While sleeve 320 may be retained in housing portion 140 by friction, sleeve 320 preferably has a resilient projection 321 that snaps outwardly into a recess in the interior surface of housing 140 and compartment 302 to retain sleeve 320 therein, or sleeve 320 may be retained therein by a weld, adhesive or other suitable fastener.

Interior to sleeve 320 is a contact spring 324. Contact spring 324 is preferably a "christmas tree" shaped spring having, e.g., a tapered helical coil 324a at one end that ends at a relatively diameter compatible with contact ring 312 of contact strip 310 so as to make electrical contact therewith and at the other end 324b, beyond a larger diameter portion, preferably reduces to a relatively small diameter, e.g., having a relatively flat or short spiral portion, so as to provide an electrical contact 324b to which a terminal at the end of a battery can make electrical contact.

Contact 324 expands to a length sufficient to contact the terminal at the end of a relatively larger diameter battery that is near or abuts the forward end of sleeve 320 and is compressible so as to allow compartment 302 to accept the length of a battery of relatively smaller diameter the end of which extends into the reduced diameter portion of compartment 302 defined by sleeve 320. Generally, but not necessarily, the battery of relatively larger diameter $D_L$ is also the battery having a relatively shorter length $L_S$ and the battery of relatively smaller diameter $D_S$ is also the battery having a relatively longer length $L_L$, e.g., as is the case comparing a size CR123 battery and a size AA or AAA battery.

Preferably, but optionally, a cup-shaped polarity ring 322 receives the end 324b of spring 324 and is movable axially in sleeve 320 and compartment 302 for adjusting to the length of a battery or batteries that may be placed therein. Connection may be made to contact 324 through opening 322h, however, contact 324 preferably does not extend through opening 322h, and so a flat terminal, e.g., a flat end of a battery, placed against polarity ring 322 preferably does not make electrical contact with spring 324. Polarity ring 322 is preferably retained in sleeve 320 by a circular ridge or other feature at the open or forward end thereof and so is inserted into sleeve 320 along with spring 324 before sleeve 320 is inserted into compartment 302.

Polarity ring 322 preferably has a central opening 322h in the relatively flat circular end thereof that is of a size sufficiently large as to permit the relatively smaller diameter of a male end terminal of a battery, such as the male positive terminal of typical batteries of the common AA, AAA, C, D, CR123 and CR2 sizes, to enter therein, but is sufficiently small as to not permit the flat end of such battery to enter therein. Since a battery inserted in compartment 302 in the incorrect (reverse of intended) orientation cannot make electrical connection with contact 324, it cannot connect an opposite polarity voltage that might damage the electronic circuitry of light 10.

Electrical connection between battery contact 324 and light source 230 is provided by a contact strip 310 which includes a conductive strip 314 extending from a circular contact ring 312 at one end thereof to a tip 316 at the other end thereof. Contact ring 312 is preferably circular and is disposed in seat 146 at the bottom (closed) end of compartment 302 of housing 140 at which the end of portion 324a of contact 324 makes electrical contact and tip 316 is connected to light source 230, e.g., by being soldered to circuit board 234.

At the other (open) end of compartment 302, battery ring 156 is disposed coaxially in tail cap housing 152 to retain spring contact 154 therein and to provide a reduced diameter seat 157 for an end of a battery in compartment 302. Specifically, battery ring 156 has a cylindrical recess 157 of relatively smaller diameter $D_S$ in which the circular end of a battery of relatively smaller diameter may rest, or in other words, battery ring 156 has an internal shoulder 157 against which the circular end of such battery may rest. The bottom end of ring 156 is seated in a circular groove in the bottom of cap 152 in which ring 156 is retained by, e.g., friction, a weld, adhesive or other suitable fastener.

Battery contact 154 includes a contact spring 154 that is preferably a double concentric coil or "trap" spring 154. Spring 154 preferably has an inner helical portion 154a of a relatively smaller diameter and a relatively longer length and preferably has an outer helical portion 154b of a relatively larger diameter and a relatively shorter length. Inner portion 154a extends from a relatively smaller diameter end at which contact to the end of a battery is to be made to a relatively larger diameter section at the bottom of cap 152 which includes a relatively flat spiral that spirals outward further to the relatively larger diameter of outer portion 154b. Battery ring 156 preferably has one or more notches or openings at the bottom end thereon through which spring 154 passes.

Preferably the inner portion 154a of contact spring 154 is a tapered helical portion and the relatively larger diameter outer portion is of substantially the same diameter over its length. Inner spring portion 154a expands at least as far as the end of battery ring 156, and preferably slightly farther, so as to be able to make contact with the end of a battery of a relatively larger diameter $D_L$ and is compressible at least as far as shoulder 157 so as to allow the end of a battery of relatively smaller diameter $D_S$ to seat near to or against shoulder 157.

When cap 150 is screwed onto housing 110, e.g., onto threads 142 of housing portion 140, outer coil 154b of battery contact spring 154 electrically connects to contact ring 330 which has an end 336 that connects to light source 230. Specifically, contact ring 330 has a flared ring 332 that is seated at the circular end 142 of housing portion 140, and has a conductor strip 334 that extends into battery compartment 302 and through an opening in housing 110 into light source compartment 124 thereof. Tip 336 at the opposite end of conductor strip 334 is connected to light source 230, e.g., by being soldered to circuit board 234.

In addition, clip 160 preferably has a keyhole shaped opening 164 in arm member 162 thereof for attaching light 10 to a mounting post, e.g., as described in U.S. Pat. No. 7,581,847 entitled "CLIP-ON, CLIP OFF MOUNTING DEVICE, AS FOR A PORTABLE LIGHT," which is hereby incorporated herein by reference in its entirety. Housing 110 may include an absorbent package or pellet 191, e.g., a "de-oxo" pellet, in the interior thereof for absorbing hydrogen, however, a different or another pellet that absorbs moisture or another undesirable substance could be provided.

Figure 4:
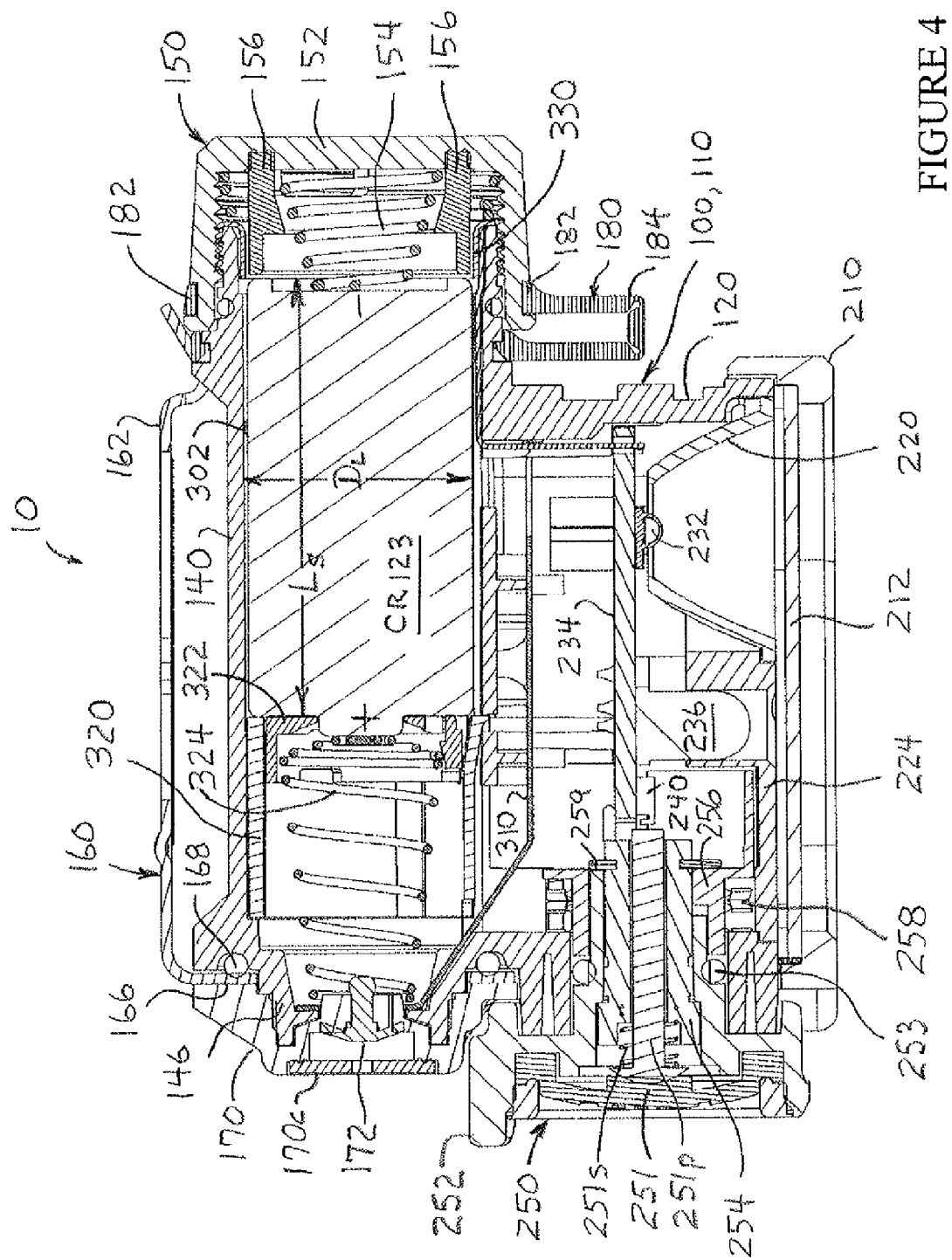
FIG. 4 is a cross-sectional view of the example light with a first type of battery therein.
Figure 5:
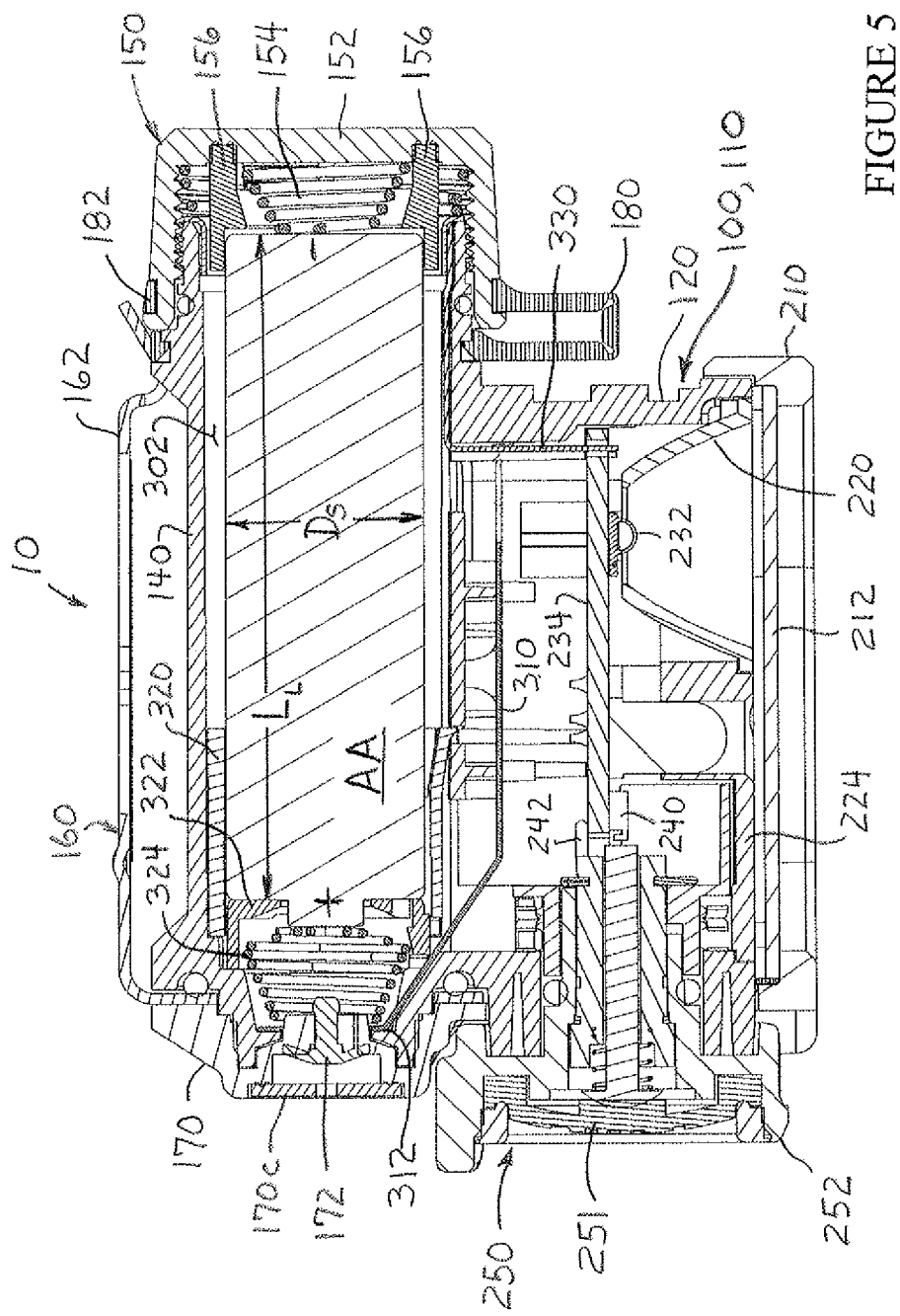
FIG. 5 is a cross-sectional view of the example light with a second different type of battery therein.

FIG. 4 is a cross-sectional view of the example light 10 with a first type of battery (e.g., a type CR123 battery) therein; and FIG. 5 is a cross-sectional view of the example light 10 with a second different type (e.g., a type AA battery) of battery therein. While a single battery (or package of cells) is illustrated, compartment 302 may be of a longer length so as to accommodate plural batteries. It is noted that internal details, e.g., of cover 170, its cap 170c and vent 172 therein, of circuit board 234 and light sources 232, 236 and switch 242 thereon, of selector 250 and elements 251-259 thereof, and of reflector 120 therein, are visible. Resilient switch actuator 251 includes an axially movable actuator pin 251p that extends through the center of shroud 254 to communicate movement of actuator 251 for actuating electrical switch 242 on circuit board 234 and to return away from switch 242 under bias by spring 251s.

In FIG. 4, light 10 is illustrated with a size CR123 battery in compartment 302 wherein battery CR123 is of relatively shorter length $L_S$ and of relatively larger diameter $D_L$ thereby to substantially fill the diameter $D_L$ of compartment 302. The relatively flat or negative (−) terminal end of battery CR123 is adjacent the end of battery ring 156 and the raised center or positive (+) terminal end of battery CR123 is adjacent the end of sleeve 320. Polarity ring 322 is biased by spring 324 to move to the open end of sleeve 320 and both of spring contacts 154 and 324 are expanded so as to contact the negative (−) and positive (+) terminal ends of battery CR123, respectively.

In FIG. 5, light 10 is illustrated with a size AA battery in compartment 302 wherein battery AA is of relatively longer length $L_L$ and of relatively smaller diameter $D_S$ thereby to not substantially fill the diameter $D_L$ of compartment 302. The relatively flat or negative (−) terminal end of battery CR123 is in recess 157 of battery ring 156 adjacent shoulder 157 thereof and the raised center or positive (+) terminal end of battery AA is in interior of tubular sleeve 320. The bias of polarity ring 322 by spring 324 is overcome by battery AA to move polarity ring 322 to a position within the interior of sleeve 320 and both of spring contacts 154 and 324 are compressed and contact the negative (−) and positive (+) terminal ends of battery CR123, respectively.

Figure 6:
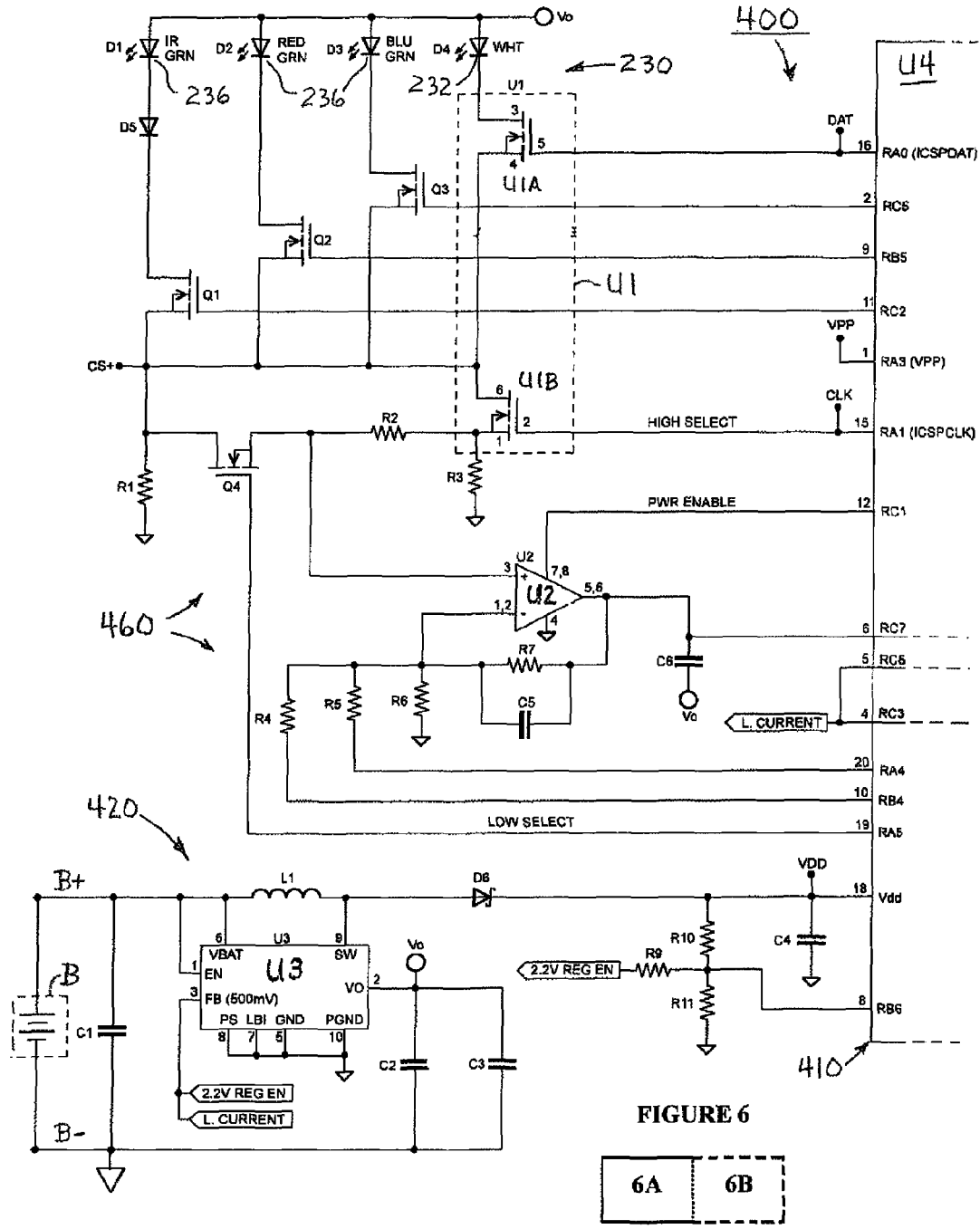
FIG. 6, separated into parts 6A and 6B, is an electrical schematic diagram of example electronic circuitry suitable for use with the example portable light.

FIG. 6, separated into parts 6A and 6B, is an electrical schematic diagram of example electronic circuitry 400 suitable for use with the example portable light 10. It is noted that the different batteries may not only be of different sizes and shapes, e.g., a CR123 size and shape and an AA size and shape, but batteries of those sizes and shapes typically are of different types, e.g., different internal chemistries, and so produce different terminal voltages. For example, CR123 batteries typically employ a lithium chemistry and produce about 3 volts when fresh whereas AA and AAA batteries typically employ a carbon-zinc, alkaline, Ni—Cd or Ni—MH chemistry and produce about 1.2-1.5 volts. As any of those batteries are discharged in use, the voltage they produce tends to decrease until it reaches such a low voltage, e.g., about 0.5-0.8 volts, at which the battery lacks sufficient energy to operate light 10 or at which light 10 and/or the circuitry thereof is unable to operate.

To accommodate a range of voltages produced by different types of batteries, light 10 preferably includes electronic circuitry 400 that can receive and operate over a range of input (e.g., battery B) voltages, e.g., a range of about 0.5-0.9 to about 3.5 volts, and that can transform a voltage in that range to a preferred output voltage, e.g., in a range of about 2.5-4.3 volts, suitable for operating light source 230 at a desired operating condition, typically at a desired current level. Typically such electronic circuitry 400 is disposed on an electronic circuit board, e.g., on electronic circuit board 234, contained within light 10.

Electronic circuitry 400 may include, e.g., a controller 410, a power conditioning circuit 420, a selector detection and decoding circuit 440, a light source selection and current controlling circuit 460 and an ON/OFF signaling circuit 480. Controller 410 is preferably an integrated circuit U4 that includes processing for controlling and operating light 10 and a memory for storing instructions for controlling and operating light 10, e.g., software instructions. Integrated circuit U4 preferably is a digital processor, such as a microprocessor, that receives signals at several of its terminals, that processes those received signals in accordance with software instructions stored in its memory, and that provides controlling signals at others of its terminals for controlling electronic circuits connected thereto that control and operate, e.g., power conditioner 420, light source 230, selector detector 440, and current control 460.

A user or operator of light 10 controls the operation of light 10 by actuating a switch S1, e.g., of an ON/OFF signaling circuit 480. Instructions from the operator or user of light 10 are provided to controller 410 via ON/OFF signaling circuit 480 that includes a user actuated switch S1, e.g., the switch 240 that is actuated using selector actuator 251, to signal input RA2 of controller 410. Voltage transient suppression diode TV1, e.g., typically back-to-back Zener diodes or another voltage limiting device, is connected to voltage VDD through resistor R12 so that voltage VDD is applied to terminal RA2 of controller 410, U4 which voltage is reduced to about zero when normally open switch S1, 240 is actuated to become closed.

Switch S1, 240 may be actuated one or more times and/or for various times and durations for signaling a desired operating condition. For example, a single momentary actuation may be employed to turn light 10 ON if it is OFF and to turn light 10 OFF if it is ON. For example, a longer actuation may be employed to turn light 10 ON and the duration of the actuation may be detected by controller 410, U4, e.g., for adjusting the brightness of light source 230, and a sequence of momentary actuations may be employed to signal controller 410, U4 to cause light source 230 to operate in a blinking mode or in a flashing mode or in a strobe mode, or in another desired mode.

Power conditioning 420 may include a DC-DC voltage boosting and regulating circuit 420, U3 that produces controlled output voltages VDD and Vo from the input voltage B+ from battery B (B− may be referred to as ground). In power conditioning circuit 420, power from battery B is conditioned (e.g., boosted in voltage) by a transistor switch within integrated circuit U3 (e.g., between terminals SW and PGND) that is operated in a pulse-width modulated (PWM) manner in conjunction with inductor L1, diode D6 and capacitors C2-C4, under regulating control of integrated circuit U3. Typically integrated circuit U3 includes an internal reference against which the output voltage VDD feed back signal "2.2V REG EN" is compared by integrated circuit U3 to control the level of output voltage VDD and capacitor C1 provides filtering thereof. The PWM switching frequency typically is a relatively high frequency, e.g., a frequency in the range of about 450-750 KHz, and may be set by an oscillator within power integrated circuit U3.

The voltage boosting circuit provided by power control integrated circuit U3 and its associated electronic components L1, D6, C2-C4 preferably operates in different modes when light 10 is on and when light 10 is OFF. The voltage regulating operating mode of U3 when light 10 is OFF is described first, and the current regulating operating mode of U3 when light 10 is ON and light source 230 provides light is described thereafter.

When light 10 is OFF, power conditioner 420 operates as a voltage boosting voltage regulator to provide a controlled output voltage VDD for powering controller 410, U4 in a standby mode wherein light source 230, selector detector 440 and current control 460 are turned OFF so as to reduce power consumption, i.e. the drain on battery B, when light 10 is OFF. Integrated circuit U3 senses output voltage VDD and receives voltage feedback "2.2V REG EN" via resistor voltage divider R9, R10, R11 (U4 output RB6 is open, or a high impedance). Power control integrated circuit U3 compares the output voltage VDD feed back signal 2.2V REG EN applied to its feedback input FB against its internal reference (e.g., typically about 0.5 volts) to control the level of output voltage VDD and capacitor C1 provides filtering thereof. Because the current control 460 is OFF, the current feedback signal "L CURRENT" is zero and integrated circuit U3 operates in a voltage regulating mode. Preferably, power control integrated circuit U3 is configured to limit Vo to a desired upper limit when the input voltage B+ exceeds a desired output voltage Vo.

Because power control integrated circuit U3 and controller 410 integrated circuit U4 are continuously powered by battery B, even when light 10 is OFF, circuits U3 and U4 preferably have a very low current drain so as not to substantially drain battery B, especially during periods of non-use of light 10. To this end, circuits not needed when light 10 is OFF, e.g., selector detector 440 and current control 460, are not powered at such times. Further, controller 410 may preferably be programmed into a "standby" or "powered down" or "sleep" state wherein only the portions thereof that are necessary, e.g., to detect a user command from switch 480, are powered, and unnecessary portions, e.g., the clock, are OFF. In the example embodiment, input RA2 of controller U4, 410 is a "wake-up" or "interrupt on change" input which responds to a change in the voltage at its input to wake controller U4 out of its sleep or standby mode and return it to normal operation. Other portions of circuit 400 are also unpowered during standby, e.g., to reduce current drain, and may be powered in normal operation at a low duty cycle, e.g., at an about 10 percent (10%) duty cycle, so as to be able to perform their intended function while reducing current drain.

When light 10 is ON, power conditioner 420 operates as a voltage boosting current regulator to provide a controlled current in the selected one of LEDs D1-D4 of light source 230 which operate from power conditioner 420 output voltage Vo. In this mode, controller U4, 410 output RB6 goes to ground (e.g., B−) to disable the voltage feedback via resistors R9-R11 thereby to allow integrated circuit U3 to respond to the current feedback signal L CURRENT so as to operate as a current regulator. In this mode, the output voltage Vo is controlled to a value that produces the desired current flow in the selected one of LEDs D1-D4 and Vo is typically in the range of about 1.2-4.3 volts.

LED selection and current control circuit 460 is described below, however, for simplification of the light source selection function in the context of LED current regulation, FET transistors Q1-Q3 and U1A are simply ON/OFF transistor switches one of which is on at any given time to select its associated LED D1-D4, and so the selected LED D1-D4 is simply connected from Vo to ground via a current sensing resistor, either R1 or R3, of relatively low ohmic value. The voltage developed across current sensing resistor R1 or R3 by the current flowing in the selected LED is amplified by amplifier U2 to develop current feedback signal L CURRENT which is applied to the feedback input FB of integrated circuit U3 which varies the PWM duty cycle to adjust Vo either higher if the LED current is too low or lower if the LED current is too high, thereby to regulate the LED current to the desired value.

Optionally, but preferably, integrated circuit U3 may also include an internal voltage limiting function that limits output voltage Vo to a selectable predetermined voltage, e.g., a voltage Vo that is about 5.5 volts, when the input voltage, e.g., battery voltage B+, is higher than is the desired output voltage Vo. This may be provided by a synchronous rectifier employing a field-effect transistor (FET) which operates as a synchronous rectifier when integrated circuit U3 is operating in voltage boosting mode and as a series-pass transistor element when battery voltage B+ exceeds the desired maximum output voltage Vo.

Selector detection and decoding section 440 comprises a opto-electronic detector 444 comprising two pairs D7, Q5 and D8, Q6 of optical photo-emitters D7, D8 and optical photo-detectors Q5, Q6 wherein the photo-emitters produce light that is reflected or not reflected, or is reflected to a predetermined greater or lesser degree, by reflective surfaces of selector 250 indicative of the position to which selector 250 is rotated. Resistors R15, R16 connect to voltage VDD to determine and control the current flowing in photo-emitters D7, D8, respectively, to cause them to emit light. FET transistor Q7 preferably is operated as an ON/OFF switch responsive to the control signal applied to its control terminal (e.g., gate) from terminal RC4 of controller U4 so that transistor Q7 is ON when light 10 is ON and is OFF when light 10 is OFF, thereby to reduce the current consumed by selector detector 444 substantially to zero when light 10 is OFF to reduce the current drain on battery B.

The light produced by photo-emitters D5, D8 that is reflected or not is detected by photo-detectors Q5, Q6 to produce across resistors R13 and R14 signals RIGHT SENSOR IN and LEFT SENSOR IN which are indicative of the rotational position of selector 250. Signals RIGHT SENSOR IN and LEFT SENSOR IN are applied at terminals RC0 and RC7 of controller U4, 410 and are decoded 448 within controller integrated circuit U4 for selecting the one of LEDs D1-D4 (corresponding to LEDs 232, 236) that corresponds to the light source indicated by the rotational position of selector 250.

While transistor Q7 may simply be utilized as a switch for controlling the level of current flowing in selector detector 444, transistor Q7 may additionally be utilized to control a time sequencing of detector 444 wherein detector 444 is enabled periodically for only a short period of time, e.g., by output RC4 going high for about 0.1 milliseconds, over a longer time period, e.g., about 1.0 milliseconds, when light 10 is operated, e.g., when light source 230 is turned ON for producing light, thereby to substantially reduce the power consumed by detector 444 during times when light 10 is operated, thereby to extend the useful life of battery B.

Preferably, controller 410 performs a decoding function 448 for enabling a predetermined one of light sources D1-D4 (232, 236) responsive to the combined states of selector detector 444 output signals RIGHT SENSOR IN and LEFT SENSOR IN, i.e. one of LEDs 232, 236 is selected for each position of selector 250. With two detector signals each having two states, e.g., a high state and a low state, there are four possible combinations each corresponding to a predetermined one of the four light sources 232, 236 of example light source 230. An enabling signal related to the decoded 448 state output is applied via the one of terminals RC2, RB5, RC5 and RA0 that correspond to the selected LED D1-D4, respectfully, for controlling one of FET transistor switches Q1, Q2, Q3 and the upper transistor U1A of integrated transistors U1 to turn ON for energizing that selected one of LEDs D1-D4, respectively, of light source 230. In some instances, an LED, e.g., D1, may operate at a substantially lower voltage than other LEDS, e.g., D2-D4, and so a diode D5 may be provided is series with LED D1.

Controller 410 further selects 448 a current level corresponding to the desired operating current for the selected one of LEDs D1-D4 to be applied to that selected LED. Preferably and typically, LED 232 is a higher power LED than are the three LEDs 236 and so is operated at a relatively higher current, and the current level selection feature may include two aspects: One aspect can be considered to be a range selection and the other aspect can be considered to be a level selection within the selected range. In addition, LEDs D1-D3 typically are different, e.g., they produce light at different frequencies (i.e. at different colors) and so different operating characteristics and are operated at different current levels. For example, in one embodiment, LEDs D1-D4 produce infrared (IR), red, blue and white light, respectively and in other embodiments any of LEDs D1-D3 may be an LED that produces green light. As a result different embodiments of light 10 are easily made wherein the LEDs D1-D4 thereof may produce IR, red, blue and white light, or may produce green, red, blue and white light, or may produce IR, green, blue and white light, or may produce IR, red, green and white light, responsive to the rotational position of selector 250.

Range selection may be effected by selecting among current sensing resistors of different values, e.g., wherein resistor R1 has a relatively higher resistance thereby to select a lower current range at a given (feedback) voltage there across and resistor R3 has a relatively lower resistance thereby to select a higher current range at a given (feedback) voltage there across. First, level select 452 of controller U4 generates a range signal HIGH SELECT at terminal RA1 to cause transistor U1B to turn ON (FET Q 4 is turned OFF) thereby to select resistor R3 and a higher current range and generates a range signal LOW SELECT at terminal RA5 to cause transistor Q4 to turn ON (FET U1B is turned OFF) thereby to select resistor R1 and a lower current range. Resistor R2 buffers current sensing resistor R1 so that it is not by passed by the lower resistance of sensing resistor R3 with FET Q4 turned ON.

Level select 452 of controller 410 also generates a PWR ENABLE signal at terminal RC1 for powering feedback amplifier integrated circuit U2 when light 10 is ON thereby to enable the current feedback amplifier provided by circuit U2 to generate current feedback signal L CURRENT. Controller 410 may include a non-inverting voltage-follower amplifier OP1 for providing isolation between the output of amplifier U2 and input FB of power control circuit U3. Capacitors C5 and C6 shape the gain versus frequency characteristics of amplifier U2 for stability. Level select 452 also generates feedback gain controlling signals at terminals RA4, RB4 when light 10 is ON to insert and remove resistors R4 and R5 from the gain controlling network R6, R7 connected between the output and inverting input of amplifier U2, thereby to control the gain of non-inverting amplifier U2 and therefore the level to which the LED current is regulated within the selected range.

If selector 250 is decoded 448 to select the high current LED 232, D4, then controller 410 generates a level select 452 signal HIGH SELECT at terminal RA1 that enables (turns ON) the lower transistor U1B of integrated transistors U1 and generates a level select 452 signal LOW SELECT at terminal RA5 that disables (turns OFF) transistor Q4. When transistor U1B of integrated transistors U1 is enabled and transistor Q4 is disabled, the current flowing in the selected higher current LED 232, D4 is sensed by a relatively lower resistance resistor R3 so as to control the LED current to a relatively higher value, e.g., selecting a relatively higher range.

If selector 250 is decoded 448 to select one of the lower current LEDs 236, D1-D3, then controller 410 generates a level select 452 signal LOW SELECT at terminal RA5 that enables (turns ON) transistor Q4 and generates a level select 452 signal HIGH SELECT that disables (turns OFF) transistor U1B of integrated transistors U1. When transistor Q4 is enabled and transistor U1B is disabled, the current flowing in the selected LED D1-D4 is sensed by a relatively higher resistance resistor R1 so as to control the LED current to a relatively lower value, e.g., a relatively lower range.

Preferably, feedback control of the current flowing in the selected LED D1-D4 is realized as follows. Preferably selection transistors Q1, Q2, Q3, U1A are operated as FET transistor switches, with one being ON and the others being OFF in accordance with the selected 440 one of the LEDs D1-D4 to be energized, and control of the current is effected by controlling the voltage Vo generated by power conditioner 420 which is applied at the respective anodes of LEDs D1-D4. LED current flows from voltage bus Vo through the selected LED D1-D4 and its selection transistor Q1, Q2, Q3, U1A into the selected current sensing resistor R1, R3 to the return at battery negative B−.

The selected one of LED D1-D4 current is sensed by the selected one of current sensing resistors R1, R3 and the voltage developed there across is applied to the non-inverting (+) input terminal of feedback amplifier U2, via resistor R2 in the case of sensing resistor R3. The gain of amplifier U2 is determined by the resistors R4, R5, R6 and by resistor R7 connected between its output terminal and its inverting (−) input terminal, wherein resistors R6, R7 set a fixed gain which can be modified by controller 410 connecting and disconnecting resistors R5, R4 via terminals RA4, RB4, respectively. The signal generated by amplifier U2 at its output terminal is representative of the LED current and is applied as feedback signal L CURRENT to input FB of power controller U3 for controlling the voltage level at its voltage output Vo, thereby to control the current flowing in the selected LED D1-D4.

Figure 7:
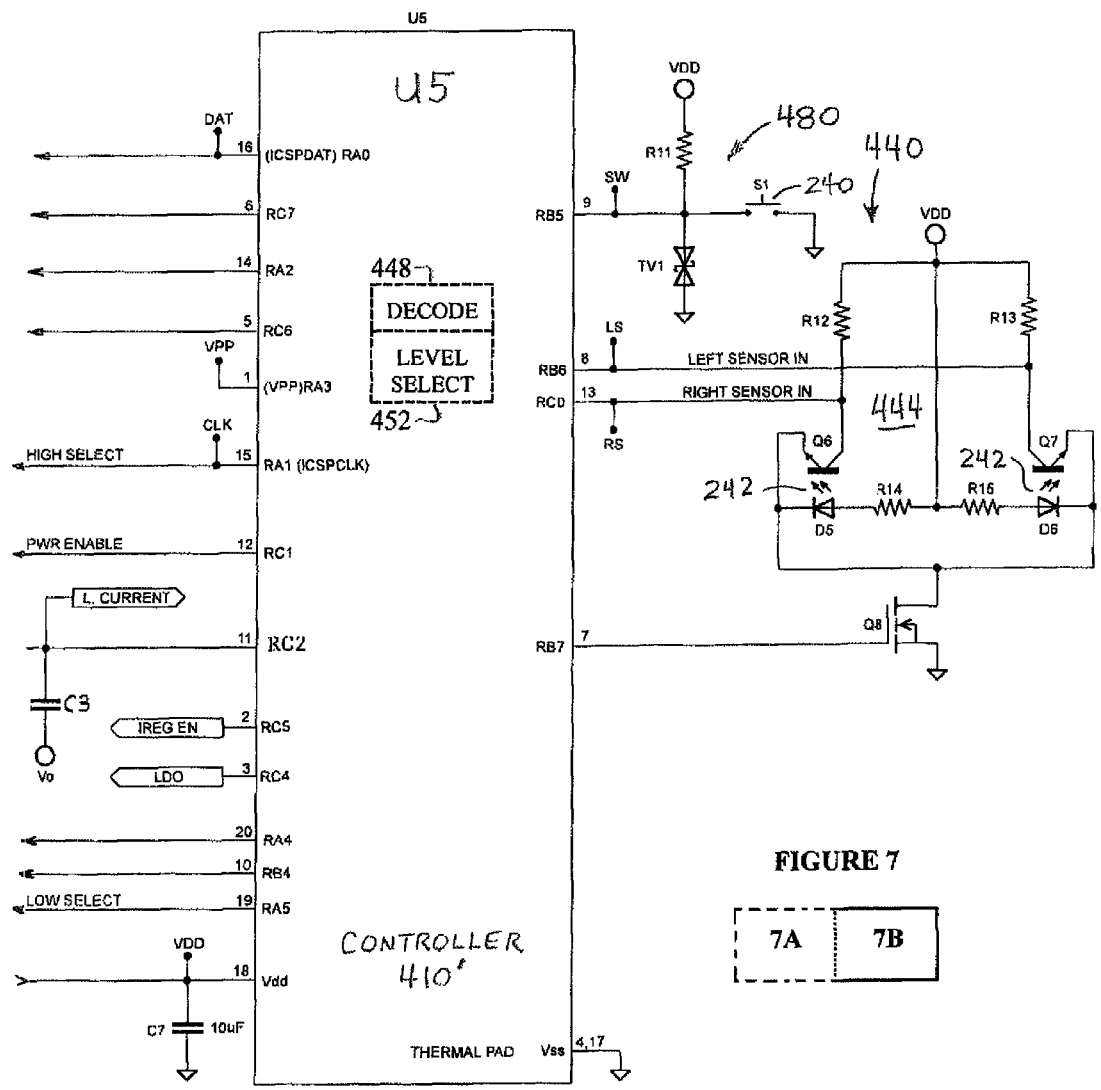
FIG. 7, separated into parts 6A and 6B, is an electrical schematic diagram of alternative example electronic circuitry suitable for use with the example portable light.
Figure 7:
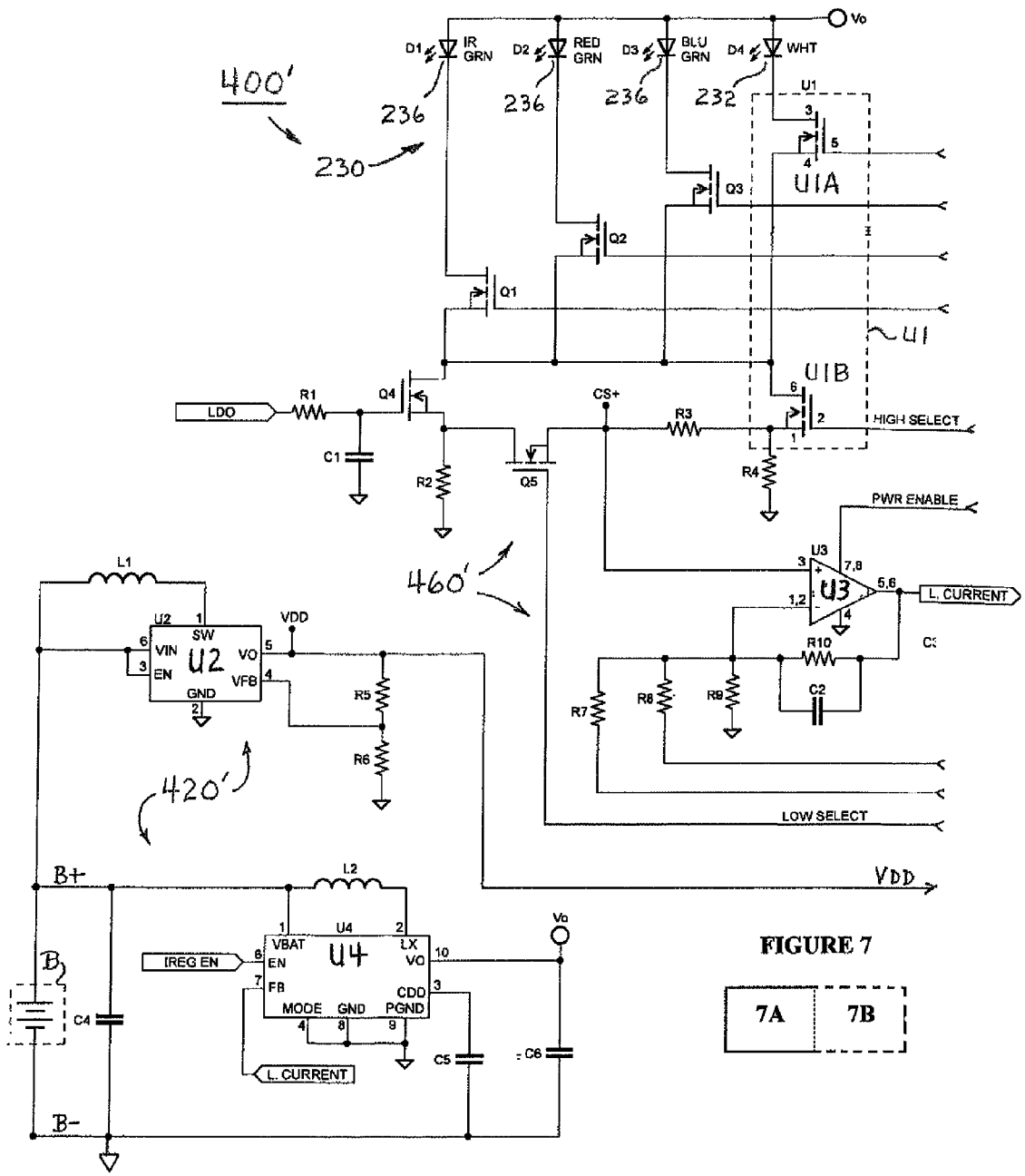

FIG. 7, separated into parts 7A and 7B, is an electrical schematic diagram of alternative example electronic circuitry 400' suitable for use with the example portable light 10. Electronic circuitry 400' is similar to circuitry 400 described above and so its description will be abbreviated because one of ordinary skill in the art will understand circuitry 400' from the description of circuitry 400. Electronic circuitry 400' also operates over a range of input (e.g., battery B) voltages, e.g., a range of about 0.5-0.9 to about 3.5 volts, and can transform a voltage in that range to a preferred output voltage, e.g., in a range of about 2.5-4.3 volts, suitable for operating light source 230 at a desired operating condition, and may be disposed on an electronic circuit board, e.g., on electronic circuit board 234, contained within light 10.

Electronic circuitry 400' may include, e.g., a controller 410', a power conditioning circuit 420', a selector detection and decoding circuit 440, a light source selection and current controlling circuit 460' and an ON/OFF signaling circuit 480. Controller U5, 410' is preferably an integrated circuit controller as above that provides controlling signals at its terminals for controlling electronic circuits connected thereto, e.g., power conditioner 420', light source 230', selector detector 440', and current control 460'.

A user or operator of light 10 controls the operation of light 10 by actuating a switch S1, e.g., of an ON/OFF signaling circuit 480, to signal at input RB5 of controller 410', as above. Switch 51, 240 may be actuated one or more times and/or for various times and durations for signaling a desired operating condition, as above.

Power conditioning 420' may include a DC-DC voltage boosting and regulating circuit 420' including power control integrated circuits U2 and U4 that respectively produce controlled output voltages VDD and Vo from the input voltage B+ from battery B. In power conditioning circuit 420', power from battery B is conditioned (e.g., boosted in voltage) by transistor switches within integrated circuit U2 and U4 (e.g., between terminals SW and GND, and terminals LX and GND). The transistor switch within integrated circuit U2 is operated in a pulse-width modulated (PWM) manner in conjunction with inductor L1, a diode internal to U2 and capacitor C7, under regulating control of integrated circuit U2, and the transistor switch within integrated circuit U4 is operated in a PWM manner in conjunction with inductor L2, a diode internal to U4 and capacitor C6, under regulating control of integrated circuit U4.

Typically integrated circuits U2 and U4 each includes an internal reference against which a feed back signal is compared by integrated circuits U2, U4 to control the level of the output voltage or current that it is controlling and capacitor C4 provides filtering of battery voltage B+. The PWM switching frequency typically is a relatively high frequency, e.g., a frequency in the range of about 450-750 KHz, and may be set by an oscillator within power integrated circuit U3.

The voltage boosting circuits provided by power control integrated circuits U2 and U4 and their associated external electronic components L1, L2, C6, C7 preferably operate in different modes. Integrated circuit U2 operates in a voltage regulating operating mode irrespective of whether light 10 is ON or OFF and is described first, and integrated circuit U4 operates in a current regulating operating mode only when light 10 is ON and light source 230 provides light and is described thereafter.

Optionally, each of power control integrated circuits U2 and U4 may also include an internal voltage limiting function that limits its output voltage, e.g., VDD and Vo, respectively, to a selectable predetermined voltage when the input voltage, e.g., battery voltage B+, is higher than is the desired output voltage VDD, Vo, although this feature is not utilized in the preferred form of this particular embodiment. This may be provided by a synchronous rectifier employing a field-effect transistor (FET) which operates as a synchronous rectifier when integrated circuit U2, U4 is operating in voltage boosting mode and as a series-pass transistor element when battery voltage B+ exceeds the desired maximum output voltage.

Integrated circuit U2 of power conditioner 420' operates as a voltage boosting voltage regulator to provide a controlled output voltage VDD for powering controller 410', U5 in a standby mode when light 10 is OFF wherein light source 230, selector detector 440 and current control 460' are turned OFF so as to reduce power consumption, i.e. the drain on battery B, when light 10 is OFF, and in the same manner when light 10 and light source 230, selector detector 440' and current control 460' are turned ON. Integrated circuit U2 senses output voltage VDD and receives voltage feedback via resistor voltage divider R5, R6. Power control integrated circuit U2 compares the output voltage VDD feed back signal applied to its feedback input VFB against its internal reference (e.g., typically about 1.2 volts) to control the level of output voltage VDD and capacitor C7 provides filtering thereof. Typically, VDD may be about 2.5 volts.

Because power control integrated circuit U2 and controller 410' integrated circuit U5 are continuously powered by battery B, even when light 10 is OFF, circuits U2 and U5 preferably have a very low current drain so as not to substantially drain battery B, especially during periods of non-use of light 10. To this end, circuits not needed when light 10 is OFF, e.g., selector detector 440 and current control 460', are not powered as such times. Further, controller 410' may preferably be programmed into a "standby" or "powered down" state and/or at a low duty cycle, as above.

When light 10 is ON, power control integrated circuit U4 of power conditioner 420' operates as a voltage boosting current regulator to provide a controlled current in the selected one of LEDs D1-D4 of light source 230 which operate from power conditioner 420' output voltage Vo. In this ON mode, controller U5, 410' generates at output RCS a signal IREG EN that enables integrated circuit U4 by releasing its terminal EN from ground (e.g., B−) to operate and respond to current feedback signal L CURRENT so as to operate as a current regulator. In this mode, output voltage Vo is controlled to a value that produces the desired current in the selected one of LEDs D1-D4 and is typically in the range of about 1.2-4.3 volts.

LED selection and current control circuit 460' is described below, however, for simplification of the light source selection function in the context of LED current regulation, FET transistors Q1-Q3 and U1A are simply ON/OFF transistor switches one of which is on at any given time to select its associated LED D1-D4, and so the selected LED D1-D4 is simply connected from Vo to ground via a current sensing resistor, either R2 or R4, of relatively low ohmic value. The voltage developed across current sensing resistor R2 or R4 by the current flowing in the selected LED is amplified by amplifier U3 to develop current feedback signal L CURRENT which is applied to the feedback input FB of integrated circuit U4 which varies the PWM duty cycle to adjust Vo either higher if the LED current is too low or lower if the LED current is too high, thereby to regulate the LED current to the desired value, as above.

Selector detection and decoding section 440 comprises a opto-electronic detector 444 comprising two pairs D5, Q6 and D6, Q7 of optical photo-emitters D5, D6 and optical photo-detectors Q6, Q7 wherein the photo-emitters produce light that is reflected or not reflected, by reflective surfaces of selector 250 indicative of the position thereof, as above. Resistors R14, R15 connect to voltage VDD to determine and control the current flowing in photo-emitters D5, D6, respectively, to cause them to emit light. FET transistor Q8 preferably is operated as an ON/OFF switch responsive to the control signal applied to its control terminal (e.g., gate) from terminal RB7 of controller U5 so that transistor Q8 is ON when light 10 is ON and is OFF when light 10 is OFF, as above.

The light produced by photo-emitters D5, D6 that is detected by photo-detectors Q6, Q7 produces across resistors R12 and R13 signals RIGHT SENSOR IN and LEFT SENSOR IN which are indicative of the rotational position of selector 250. Signals RIGHT SENSOR IN and LEFT SENSOR IN are applied at terminals RC0 and RB6 of controller U5, 410' and are decoded 448 thereby for selecting one of LEDs D1-D4 (LEDs 232, 236) as above.

Transistor Q8 may simply be utilized as a switch or may additionally be utilized to control a time sequencing of detector 444, as above.

Preferably, controller 410' performs a decoding function 448 for enabling a predetermined one of light sources D1-D4 (232, 236) responsive to the combined states of selector detector 444 output signals RIGHT SENSOR IN and LEFT SENSOR IN, i.e. one of LEDs 232, 236 is selected for each position of selector 250, as above. An enabling signal related to the decoded 448 state output is applied via the one of terminals RC6, RA2, RC7 and RA0 that corresponds to the selected one of LEDs D1-D4, respectfully, for controlling one of FET transistor switches Q1, Q2, Q3 and the upper transistor U1A, as above.

In some instances, one or more LEDs, e.g., D1-D3, may operate at a substantially lower voltage than the voltage B+ provided by battery B, and so the current for LEDs D1-D4 may be controlled by a transistor Q4 that may be provided is series with LEDs D1-D4 for controlling the level of current flowing through LEDs D1-D4 responsive to a feedback signal LDO. When the battery voltage B+ exceeds the voltage needed to operate the selected one of LEDs D1-D4, then FET Q4 is operated in a linear (analog) mode for controlling the level of current flowing through LEDs D1-D4 responsive to a feedback signal LDO. When the battery voltage B+ is less than that needed to operate the selected LED D1-D4 and so power control U4 is operated in a voltage boosting mode, then FET Q4 is turned fully ON as a switch by signal LDO and control of the current flowing in the selected LED D1-D4 is controlled by power control U4 responsive to the current feedback signal L CURRENT. Feedback signal LDO is produced by controller U5, 410' responsive to the current feedback signal L CURRENT produced by amplifier U3 and received at terminal RC2 of controller U5 which includes a comparator for generating signal LDO. Resistor R1 and capacitor C1 decrease gain at higher frequencies for stability.

Controller 410' further selects 448 a current level corresponding to the desired operating current for the selected one of LEDs D1-D4, e.g., to accommodate higher and lower power LEDs and provide range selection and level selection as above. For example, in the illustrated embodiment, as in circuit 400, different embodiments of light 10 are easily made wherein the LEDs D1-D4 thereof may produce IR, red, blue and white light, or may produce green, red, blue and white light, or may produce IR, green, blue and white light, or may produce IR, red, green and white light, responsive to the rotational position of selector 250.

Range selection may be effected by selecting among current sensing resistors of different values, e.g., wherein resistor R2 has a relatively higher resistance and resistor R4 has a relatively lower resistance, as above. Level select 452 of controller U5 generates a range signal HIGH SELECT at terminal RA1 and a range signal LOW SELECT at terminal RA5 to cause transistors Q4 and U1B to turn ON and OFF thereby to select one of resistors R2 and R4 as above. Resistor R3 buffers current sensing resistor R2 when FET Q4 is turned ON as above.

Level select 452 of controller 410' also generates a PWR ENABLE signal at terminal RC1 for powering feedback amplifier integrated circuit U3 for generating current feedback signal L CURRENT as above. Controller 410' may include a non-inverting voltage-follower amplifier for providing isolation between amplifier U3 and control circuit U4 as above. Capacitors C2 and C3 shape the gain versus frequency characteristics of amplifier U3 for stability. Level select 452 also generates gain controlling signals at terminals RA4, RB4 when light 10 is ON to insert and remove resistors R7 and R8 from the gain controlling network R9, R10, thereby to control the level to which the LED current is regulated as above.

If selector 250 is decoded 448 to select the high current LED 232, D4, then controller 410' (e.g., level select 452) generates a signal HIGH SELECT at terminal RA1 and a signal LOW SELECT at terminal RA5 that disable and enable (turns OFF and ON) transistors U1B and Q5 similarly to transistors U1B and Q4 above, and a signal LDO at terminal RC4 that goes low to disable (turn OFF) transistor Q4. When transistor U1B is enabled and transistors Q4, Q5 are disabled, the current flowing in the selected higher current LED 232, D4 is sensed by a relatively lower resistance resistor R4 as above.

If selector 250 is decoded 448 to select one of the lower current LEDs 236, D1-D3, then controller 410' (e.g., level select 452) generates signals LOW SELECT and HIGH SELECT that enables transistor Q4 and disables transistor U1B, and the current flowing in the selected LED D1-D4 is sensed by a relatively higher resistance R2 as above.

Preferably, feedback control of the current flowing in the selected LED D1-D4 is realized as above with selection transistors Q1, Q2, Q3, U1A operated as FET switches, with one being ON and the others being OFF in accordance with the selected 440 one of the LEDs D1-D4 to be energized, and control of the current is effected by controlling the voltage Vo generated by power control U4 of power conditioner 420' as above.

The selected one of LED D1-D4 current is sensed by the selected one of current sensing resistors R1, R3 and the voltage developed there across is applied to the non-inverting (+) input terminal of feedback amplifier U3, via resistor R3 in the case of sensing resistor R4. The gain of amplifier U3 is determined by the resistors R7, R8, R9 and by resistor R10 connected between its output terminal and its inverting (−) input terminal, that may be modified by controller 410' connecting and disconnecting resistors R7, R8 via terminals RB4, RA4, respectively, as above. The signal generated by amplifier U2 is representative of LED current and is applied as feedback signal L CURRENT to input FB of power controller U3 for controlling the voltage level at its voltage output Vo, thereby to control the current flowing in the selected LED D1-D4, as above.

It is noted that because the transistors connected in series with and in light source 230, e.g., in series with LEDs D1-D4, (232, 236), and current control 460, 460' are utilized as ON/OFF switches and because the current sensing resistors are of small ohmic value, those electronic elements dissipate only a small amount of power, and so with power conditioner 420, 420' operating in a current regulating mode with it output voltage Vo being allowed to vary as needed to establish the desired current in LEDs D1-D4, (232, 236), circuit 400, 400' tends to operate at or close to an optimum efficiency condition. Moreover, because the current flowing in the selected one of LEDs D1-D4, (232, 236) is individually established and controlled, the value of that current may be selected to tend to optimize or nearly optimize operation of the LEDs, e.g., for brightness level and/or for operating efficiency. Accordingly, the operating time obtainable from a particular battery also tends to be extended, if not be optimized.

Figure 8:
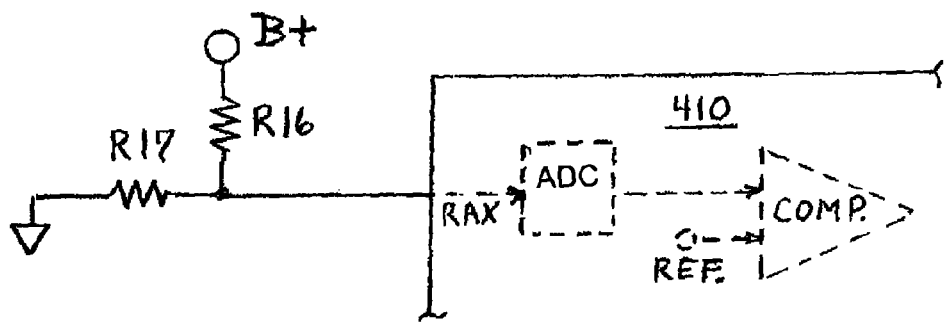
FIG. 8 is a schematic diagram of an example embodiment of a circuit for measuring a voltage.

FIG. 8 is a schematic diagram of an example embodiment of a circuit for measuring a voltage. The voltage to be measured, e.g., the battery voltage B+, is applied to an input of controller 410 which determines the magnitude of the applied voltage B+. Where the applied voltage B+ may be significantly greater than the voltage VDD that powers controller 410, a voltage divider including resistors R16, R17 may be employed to reduce the magnitude of voltage applied to input RAX of controller 410. Alternatively, the magnitude of voltage VDD may be increased, e.g., from about 2.5 volts to about 3 volts where the battery voltage B+ is about 3.5 volts or less, and voltage divider may be removed, e.g., by replacing resistor R16 by a conductor and resistor R17 by an open circuit.

The voltage to be measured, e.g., battery voltage B+, whether applied directly or reduced by resistive voltage divider R16, R17, is measured and compared to a target value for determining the type of battery installed in light or device 10. In a digital controller 410, the battery voltage B+ is applied to an analog-to-digital converter ADC included in controller 410 which converts voltage B+ to a digital signal which is then compared digitally to a predetermined digital target value for determining whether the magnitude of voltage B+ is greater or less than the pre-determined target value. The result of that comparison may then be employed by controller 410 for establishing and/or modifying an operating condition of the light 10 or other device controlled thereby. In a light 10, the operating condition established and/or modified may include the operating point of any one or more of the LEDs comprising light source 230, e.g., the current level flowing therein.

In FIG. 8, the digital comparison function, which is performed using software programming, is represented symbolically by a dashed "comparator" COMP making a comparison with a reference magnitude REF. Typically, the analog-to-digital converter ADC of a typical controller IC 410 is capable of resolving voltage differences on the order of about 3-5 millivolts which is adequate for the described detection.

Figure 9A:
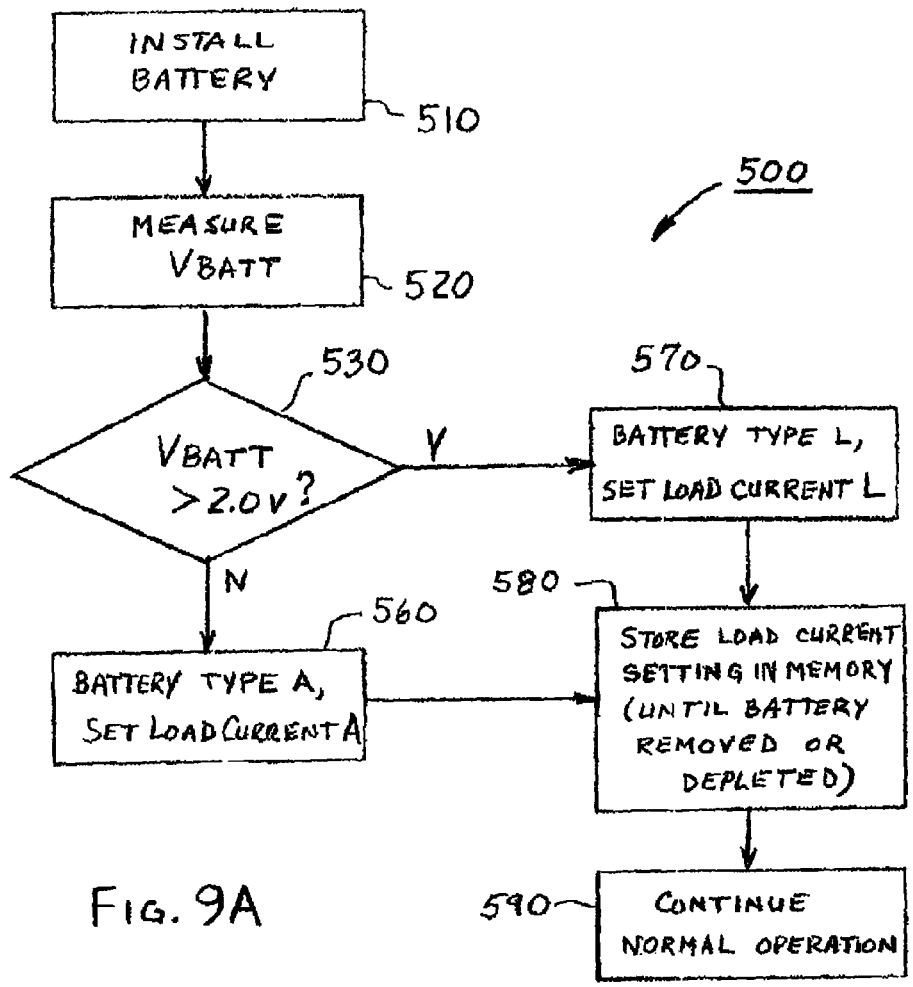
FIG. 9 includes FIGS. 9A and 9B which are schematic flow diagrams for example embodiments of a method for measuring a voltage and responding thereto.

FIG. 9 includes FIGS. 9A and 9B which are schematic flow diagrams for example embodiments of a method 500, 500' for measuring a voltage and for responding thereto. In a light or device 10, not only may batteries of different sizes and different shapes be accommodated in compartment 302 of housing 110, but also batteries of different types, e.g., of different internal chemistries that provide different battery voltages and that have different energy storage capacities. It may be advantageous for light or device 10 to distinguish between the different types of batteries placed into light or device 10 so as to establish an operating condition thereof and/or to modify an operating condition thereof.

For example, batteries employing a lithium chemistry provide a voltage of about 3.0-3.2 volts per cell whereas batteries employing an alkaline chemistry provide a voltage of about 1.5 volts and those employing a Ni—Cd chemistry provide a voltage of about 1.0-1.2 volts. Because lithium chemistry batteries have a greater energy storage capacity than do either alkaline or Ni—Cd chemistry batteries of the same physical size, a light merely operating its light source at a given operating condition will consume an alkaline or Ni—Cd battery much more quickly than it would a lithium battery.

Where the operating time, e.g., run time, with different types of batteries are all relatively long, e.g., where one type of battery provides a four hour run time and a different battery provides a five hour run time, the difference may not be important to a user of the light or device 10. However, where one type of battery provides a substantial run time, e.g., a three and one-half hour run time, and a different type of battery provides a much shorter run time, e.g., a thirty minute run time, the difference may be important to a user and, in certain situations, e.g., use by police, fire fighters or the military, the difference may even be critical for safety and/or protection of life.

Method 500 of FIG. 9A may be employed for distinguishing between batteries of two different chemistries placed into battery compartment 302 of light 10. Examples include distinguishing between batteries of a three-volt lithium chemistry, e.g., a CR123 battery, and of an alkaline chemistry, e.g., a 1.5 volt AA or AAA alkaline battery, or between batteries of a three-volt lithium chemistry, e.g., a CR123 battery, and of a Ni—Cd chemistry, e.g., an 1.2 volt AA size Ni—Cd battery. When a battery is installed 510 in light 10, e.g., is placed in compartment 302 thereof, its voltage VBATT is measured 520 and is compared 530 to a predetermined level, e.g., about 2.0 volts for distinguishing between a lithium battery and an alkaline battery.

If the result of comparison 530 is that VBATT is greater than the predetermined value, then path Y is followed from comparison 530 because the battery is a type "L" battery, e.g., a lithium battery. Since the battery is of a type having a relatively greater energy storage capacity, light 10 may be operated at a preferred operating condition, e.g., operating light source 230 at a higher brightness level, and still provide a satisfactory run time. The operating condition of light 10 may be set 570 to a predetermined operating condition, e.g., setting an operating load current level L for light source 230 or other load that corresponds to, e.g., a higher brightness level.

If the result of comparison 530 is that VBATT is less than the predetermined value, then path N is followed from comparison 530 because the battery is a type "A" battery, e.g., an alkaline battery. Since the battery is of a type having a relatively smaller energy storage capacity, light 10 may be operated at a different preferred operating condition, e.g., operating light source 230 at a lower brightness level, so as to still provide a satisfactory run time which may be, however, less than that obtainable from a type L battery. The operating condition of light 10 may be set 560 to a different predetermined operating condition, e.g., setting a relatively lower operating load current level A for light source 230 or other load that corresponds to, e.g., a lower brightness level, thereby to obtain a longer run time than would otherwise be obtainable from a battery of type A if light or device 10 were to be operated at the higher load current L.

Whichever operating condition is selected and set 560, 570, an indiction of that condition, e.g., load current L or load current A, is stored 580 in the memory of controller 410 so as to be available for controlling the operation condition of light or device 10 when it is ON. Method 500 is complete with light or device 10 continuing 590 in normal operation, e.g., responding to commands received via selector 250 and switch 251, 242, S1 from time to time.

It is noted that method 500 is performed only when a battery is placed into the battery compartment 302 thereof and method 500 does not turn light or device 10 ON, but method 500 does set the operating condition under which light or device 10 will operate when it is commanded by a user. The operating condition set 560, 570 remains stored 580 until the battery is removed from compartment 302 at which time operating voltage Vdd is removed from controller 410 which turns OFF until it initializes when a battery is placed in compartment 302 thereby to initiate method 500.

Method 500' of FIG. 9B may be employed for distinguishing between batteries of three different types placed into battery compartment 302 of light 10. Examples include distinguishing between batteries of a three volt lithium chemistry, e.g., a CR123 battery, of a 1.0-1.5 volt alkaline or Ni—Cd chemistry, e.g., an AA or AAA alkaline or Ni—Cd battery, and of a 1.5 volt lithium chemistry, e.g., an AA size lithium battery. When a battery is installed 510 in light 10, e.g., is placed in compartment 302 thereof, its voltage VBATT-1 is measured 520 and is compared 530 to a predetermined level, e.g., about 2.0 volts for distinguishing between a 3 volt lithium battery and a 1.5 volt battery of alkaline, Ni—Cd or lithium chemistry.

If the result of comparison 530 is that VBATT-1 is greater than the predetermined value, then path Y is followed from comparison 530 because the battery is a type "L" battery, e.g., a CR123 lithium battery that provides about 3.0-3.2 volts. Since the battery is of a type having a relatively greater energy storage capacity, light 10 may be operated at a preferred operating condition, e.g., operating light source 230 at a higher brightness level, and still provide a satisfactory run time. The operating condition of light 10 may be set 580 to a predetermined operating condition, e.g., setting a higher operating load current level ILOAD L for light source 230 or other load that corresponds to, e.g., a higher brightness level.

If the result of comparison 530 is that VBATT is less than the predetermined value, then path N is followed from comparison 530 because the battery is a type "A" or a type "N" battery, e.g., an alkaline or Ni—Cd battery or a 1.5 volt lithium battery. Since the battery may be of a type having a relatively smaller energy storage capacity, further processing 540, 550 is required so as to determine whether light 10 may be operated at a preferred operating condition or at a different preferred operating condition, e.g., operating light source 230 at a lower brightness level, so as to still provide a satisfactory run time which may be, however, less than that obtainable from a type L battery.

Load testing 540 provides measurements and testing 550 performs comparisons for distinguishing among different types of batteries B that provide similar voltages, e.g., voltages on the order of 1.0-1.5 volts, and so cannot be easily or reliably distinguished by a simple voltage measurement and comparison. Such simple comparison would be unreliable even if the battery is fresh, and it becomes less reliable as a particular battery may have experienced partial discharge, e.g., from prior use, temperature and/or a self discharge over a long period of storage.

Load testing steps 540 apply 542 a load to the battery B for a predetermined time period 544 for evaluating 546 its performance under a significant load, preferably without depleting the energy stored therein materially. A known load is applied 542 to the battery for a predetermined delay period 544 before the battery voltage VBATT-2 is measured 546, after which the load is removed 548. In one example embodiment, the load applied 542 includes activating the control transistor of selector detector 440, e.g., transistor Q7 in circuit 400 or transistor Q8 in circuit 400' so that selector detector 440 draws current from supply VDD which is powered by battery B. The activation time period, delay 544, can be less than one minute, and typically about 45 seconds is sufficient, which does not materially discharge battery B.

Comparison 550 includes determining 552 the voltage change $\Delta V$ that occurred over the delay time 544 which is obtained by subtracting the final measured battery B voltage VBATT-2 from the initial voltage VBATT-1. That voltage difference $\Delta V$ will be greater, e.g., for a 1.5 volt lithium battery than for an alkaline or Ni—Cd battery. If the voltage difference $\Delta V$ is greater than the predetermined trip value, e.g., typically in a range of about 0.02-0.25 volts, then the battery is a lithium battery, e.g., is a type L, and path Y is taken from comparison 554 and so the load current is set 570 to the typically higher ILOAD L level. If the difference 552 is less than 554 a predetermined trip value, path N is taken from comparison 554 because small difference indicates that the battery B is not a lithium battery, but is an alkaline or Ni—Cd battery, e.g., a type AN battery, and the load current can be set 560 to the ILOAD AN setting. The trip value can be dependent upon many factors including, e.g., the applied loading, the loading time delay, and the like, and may be determined empirically.

Thus the operating condition of light 10 may be set 560, 570 to a different predetermined operating condition, e.g., setting a relatively lower operating load current level A for light source 230 or other load that corresponds to, e.g., a lower brightness level, thereby to obtain a longer run time than would otherwise be obtainable from a battery of type A or type N if light or device 10 were to be operated at the higher load current ILOAD L.

Whichever operating condition is selected and set 560, 570, an indiction of that condition, e.g., load current L or load current A, is stored 580 in the memory of controller 410 so as to be available for controlling the operation condition of light or device 10 when it is ON. Method 500' is complete with light or device 10 continuing 590 in normal operation, e.g., responding to commands received via selector 250 and switch 251, 242, S1 from time to time.

It is noted that the foregoing methods 500 and 500' are performed only when a battery is placed into the battery compartment 302 of light or device 10 and method 500, 500' does not turn light or device 10 ON, but method 500, 500' does set the operating condition under which light or device 10 will operate when it is commanded by a user. The operating condition set 560, 570 remains stored 580 until the battery is removed from compartment 302 at which time operating voltage Vdd is removed from controller 410 which turns OFF until it initializes when a battery is placed in compartment 302 thereby to initiate method 500, 500'.

In one preferred embodiment, controller 410 is preferably configured to initially set the LED light source 230 current to the lower value, e.g., ILOAD A or ILOAD AN, that produces a brightness level of about 40 lumens. If battery B is a CR123 lithium battery, then processor 410 modifies the operating condition or light 10 to operate light source 230 at the current ILOAD L which causes light source 230 to produce a brightness of about 50 lumens. If battery B is not a CR123 lithium battery, then processor 410 initially operates light source 230 at a current level that produces a light output of about 40 lumens which is, e.g., the brightness produced by a current ILOAD A or ILOAD AN. If testing method 500, 500' determines that battery B is a lithium chemistry battery, then processor 410 increases the current to light source 230 to ILOAD L which increases the brightness to about 50 lumens, otherwise the load current remains at ILOAD A or ILOAD AN which produces a brightness level of about 40 lumens.

In one alternative, one type of battery may be considered the default battery type. The current level to be set 560, 570 for that default type of battery may then be predetermined as a default current setting for normal operation 590. If the battery placed 510 into housing 110 is determined 520, 530, 540, 550 to be the default battery type, then the steps of setting the load current and storing 560 or 570 the load current setting 580 for the default battery type may be eliminated and normal operation 590 may directly follow step 530 of method 500 or step 550 of method 500'. If the battery is determined 520, 530, 540, 550 to be of a type other than the default type, then method 500, 500' proceeds through steps 560, 570, 580 as described.

In a typical embodiment of light 10, light housing 110, including housing portions 120, 140, cover 210, and cap 150, as well as parts of selector 250 and interior parts 220, 224, 320, 322, 156 may be a metal or plastic, e.g. aluminum, a nylon, a glass-filled nylon, ABS, polycarbonate, or other suitable metal or plastic, and lens 240 may be polycarbonate, acrylic, clear ABS, or other suitable plastic or glass, and conductive strips 310, 330 may be brass, copper, aluminum, phosphor bronze, or other suitable material, and may have a suitable plating, e.g., gold, silver, nickel, tin or solder. Tether 180 may be of a rubber or a flexible plastic, e.g., a low density or other polyethylene (LDPE), polypropylene, rubber, or other plastic.

In a typical embodiment of circuit 400, 400', power controller 420 may employ, e.g., a type TPS61028 synchronous boost converter integrated circuit available from Texas Instruments, Inc., located in Dallas, Tex., a type MCP1624 DC low-voltage input boost regulator integrated circuit available from Microchip Technology, Inc., located in Chandler, Ariz., a type XC9131 DC converter integrated circuit available from Torex Semiconductor Ltd. located in Japan, or any other suitable DC converter integrated circuit. Controller 410, 410' may employ, e.g., a type PIC 16F785 embedded micro-controller integrated circuit available from Microchip Technology, Inc., located in Chandler, Ariz., or any other suitable processor circuit of which many are available commercially from several different suppliers.

Typically, controller integrated circuits (IC) have various "ports" at which data may be received by controller IC 410 and/or provided by controller IC 410. Each "port" commonly connects to plural terminals of controller IC 410 and the functioning thereof may be configured or programmed by instructions stored in the memory of IC 410 so as to have different characteristics, e.g., to serve as an analog input, as an analog output, as a digital input or as a digital output. Typically each port corresponds to plural terminals (pins) of the physical integrated circuit, wherein when the port is configured as a digital port, each pin carries one bit of a multi-bit digital signal received and/or outputted as a parallel multi-bit digital "word" when the data output is digital, and as plural analog terminals wherein the port is configured as an analog port. One common format provides ports as, e.g., an eight-bit port (a port using eight terminals of the physical IC). In some instances, the terminals of controller IC 410 may be configured individually or in groups partly as digital terminals and partly as analog terminals.

A portable light 10 may comprise: a light source 230 for producing light when energized; a switch 250 for controlling energization of said light source 230; a light housing 110 supporting light source 230 and switch 250, light housing 110 having a cylindrical compartment 302 for receiving batteries of different sizes, wherein cylindrical compartment 302 has a relatively larger diameter in a central region thereof and has a relatively smaller diameter at least at one end thereof; and first and second electrical contacts 154, 324 at opposite ends of the cylindrical compartment 302 for making electrical connection to a battery when a battery is received therein, wherein the battery may be of a relatively larger diameter and a relatively shorter length or may be of a relatively smaller diameter and a relatively longer length. The light housing 110 may comprise: a base housing 140 having the cylindrical compartment 302 therein and having an opening; and a cap 150 for removably covering the opening of base housing 140 for accessing the cylindrical compartment 302 for placing a battery therein and for removing a battery therefrom, wherein base housing 140 includes one of first and second electrical contacts 154, 324 in the cylindrical compartment 302 thereof and wherein cap 150 includes the other of first and second electrical contacts 154, 324. Light housing 110 may comprise: a cylindrical sleeve 320 in the cylindrical compartment 302 of light housing 110 for defining the relatively smaller diameter at least at one end thereof. At least one of first and second electrical contacts 154, 324 may comprise: a spring contact 154, 324 for extending and compressing for contacting batteries of the relatively shorter length and of the relatively longer length. The portable light 10 may further comprise: a polarity ring 322 of an insulating material and having an opening of a size permitting a battery terminal of one polarity to contact one of first and second electrical contacts 154, 324 and blocking a battery terminal of the opposite polarity from contacting the one of first and second electrical contacts 154, 324. The portable light 10 may further comprise: an electronic circuit 400, 400' for receiving electrical power at voltages produced by batteries of different types and providing therefrom electrical power at a voltage Vo compatible with light source 230; or an electronic circuit 400, 400' responsive to a battery being placed in the compartment of said light housing 110 for determining the type of the battery and changing an operating condition of said light source 230 responsive thereto; or an electronic circuit 400, 400' for receiving electrical power at voltages produced by batteries of different types and providing therefrom electrical power at a voltage compatible with said light source 230 and responsive to a battery being placed in the compartment of said light housing 110 for determining the type of the battery and changing an operating condition of said light source 230 responsive thereto.

A portable device 10 may comprise: an operative element 230 for operating when energized; a switch 250 for controlling energization of operative element 230; a housing 110 supporting operative element 230 and switch 250, housing 110 having a cylindrical compartment 302 for receiving batteries of different sizes, wherein the cylindrical compartment 302 has a relatively larger diameter in a central region thereof and has a relatively smaller diameter at least at one end thereof; and first and second electrical contacts 154, 324 at opposite ends of the cylindrical compartment 302 for making electrical connection to a battery when a battery is received therein, wherein the battery may be of a relatively larger diameter and a relatively shorter length or may be of a relatively smaller diameter and a relatively longer length. Housing 110 may comprise: a base housing 140 having the cylindrical compartment 302 therein and having an opening; and a cap 150 for removably covering the opening of base housing 140 for accessing the cylindrical compartment 302 for placing a battery therein and for removing a battery therefrom, wherein base housing 140 includes one of first and second electrical contacts 154, 324 in the cylindrical compartment 302 thereof and wherein 150 cap includes the other of first and second electrical contacts 154, 324. Housing 110 may comprise: a cylindrical sleeve 320 in the cylindrical compartment 302 of housing 110 for defining the relatively smaller diameter at least at one end thereof. At least one of first and second electrical contacts 154, 324 may comprise: a spring contact 154, 324 for extending and compressing for contacting batteries of tab relatively shorter length and of the relatively longer length. The portable device 10 may further comprise: a polarity ring 322 of an insulating material and having an opening of a size permitting a battery terminal of one polarity to contact one of first and second electrical contacts 154, 324 and blocking a battery terminal of the opposite polarity from contacting the one of first and second electrical contacts 154, 324. The portable device 10 may further comprise: an electronic circuit 400, 400' for receiving electrical power at voltages produced by batteries of different types and providing therefrom electrical power at a voltage Vo compatible with said operative element; or an electronic circuit 400, 400' responsive to a battery being placed in the compartment of said housing 110 for determining the type of the battery and changing an operating condition of said operative element 230 responsive thereto; or an electronic circuit 400, 400' for receiving electrical power at voltages produced by batteries of different types and providing therefrom electrical power at a voltage compatible with said operative element 230 and responsive to a battery being placed in the compartment of said housing 110 for determining the type of the battery and changing an operating condition of said operative element 230 responsive thereto.

A portable light 10 may comprise: a light source 230 for producing light when energized; a switch 250 for controlling energization of light source 230; a light housing 110 supporting light source 230 and switch 250, light housing 110 having a compartment 302 for receiving batteries of different sizes, wherein compartment 302 has a relatively larger transverse dimension in one region thereof for receiving a battery having a corresponding relatively larger transverse dimension and has a relatively smaller transverse dimension at least at one end thereof for receiving a battery having a corresponding relatively smaller transverse dimension; and first and second electrical contacts 154, 324 in the compartment 302 for making electrical connection to the terminals of a battery when a battery is received therein, wherein the at least one of the first and second electrical contacts 154, 324 is movable within the compartment 302 for making electrical connection to the terminals of batteries having a relatively shorter length and a relatively longer length. Light housing 110 may comprise: a base housing 140 having the compartment 302 therein and having an opening; and a cap 150 for removably covering the opening of base housing 110 for accessing the compartment 302 for placing a battery therein and for removing a battery therefrom, wherein base housing 140 includes one of first and second electrical contacts 154, 324 in the compartment 302 thereof and wherein cap 150 includes the other of first and second electrical contacts 154, 324. Light housing 110 may comprise: a sleeve 320 in the compartment 302 of light housing 110 for defining the relatively smaller transverse dimension at least at one end thereof. At least one of first and second electrical contacts 154, 324 may comprise: a spring contact 154, 324 for extending and compressing for contacting batteries of the relatively shorter length and of the relatively longer length. The portable light 10 may further comprise: a polarity ring 322 of an insulating material and having an opening of a size permitting a battery terminal of one polarity to contact one of first and second electrical contacts 154, 324 and blocking a battery terminal of the opposite polarity from contacting the one of first and second electrical contacts 154, 324. The portable light 10 may further comprise: an electronic circuit 400, 400' for receiving electrical power at voltages produced by batteries of different types and providing therefrom electrical power at a voltage Vo compatible with said light source; or an electronic circuit 400, 400' responsive to a battery being placed in the compartment of said light housing 110 for determining the type of the battery and changing an operating condition of said light source 230 responsive thereto; or an electronic circuit 400, 400' for receiving electrical power at voltages produced by batteries of different types and providing therefrom electrical power at a voltage compatible with said light source 230 and responsive to a battery being placed in the compartment of said light housing 110 for determining the type of the battery and changing an operating condition of said light source 230 responsive thereto.

A portable device 10 may comprise: an operative element 230 for operating when energized; a switch 250 for controlling energization of operative element 230; a housing 110 supporting operative element 230 and switch 250, housing 110 having a compartment 302 for receiving batteries of different sizes, wherein compartment 302 has a relatively larger transverse dimension in one region thereof for receiving a battery having a corresponding relatively larger transverse dimension and has a relatively smaller transverse dimension at least at one end thereof for receiving a battery having a corresponding relatively smaller transverse dimension; and first and second electrical contacts 154, 324 in the compartment 302 for making electrical connection to the terminals of a battery when a battery is received therein, wherein the at least one of the first and second electrical contacts 154, 324 is movable within the compartment 302 for making electrical connection to the terminals of batteries having a relatively shorter length and a relatively longer length. Housing 110 may comprise: a base housing 140 having the compartment 302 therein and having an opening; and a cap 150 for removably covering the opening of base housing 140 for accessing the compartment 302 for placing a battery therein and for removing a battery therefrom, wherein base housing 140 includes one of first and second electrical contacts 154, 324 in the compartment 302 thereof and wherein cap 150 includes the other of said first and second electrical contacts 154, 324. Housing 110 may comprise: a sleeve 322 in the compartment 302 of housing 110 for defining the relatively smaller transverse dimension at least at one end thereof. At least one of first and second electrical contacts 154, 324 may comprise: a spring contact 154, 324 for extending and compressing for contacting batteries of the relatively shorter length and of the relatively longer length. The portable device 10 may further comprise: a polarity ring 322 of an insulating material and having an opening of a size permitting a battery terminal of one polarity to contact one of first and second electrical contacts 154, 324 and blocking a battery terminal of the opposite polarity from contacting the one of first and second electrical contacts 154, 324. The portable device 10 may further comprise: an electronic circuit 400, 400' for receiving electrical power at voltages produced by batteries of different types and providing therefrom electrical power at a voltage Vo compatible with operative element 230; or an electronic circuit 400, 400' responsive to a battery being placed in the compartment of said housing 110 for determining the type of the battery and changing an operating condition of said operative element 230 responsive thereto; or an electronic circuit 400, 400' for receiving electrical power at voltages produced by batteries of different types and providing therefrom electrical power at a voltage compatible with said operative element 230 and responsive to a battery being placed in the compartment of said housing 110 for determining the type of the battery and changing an operating condition of said operative element 230 responsive thereto.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. It is noted that embodiments of very different sizes, shapes and dimensions may employ the described arrangements.

Although terms such as "up," "down," "left," "right," "front," "rear," "side," "top," "bottom," "forward," "backward," "under" and/or "over," and the like may be used herein as a convenience in describing one or more embodiments and/or uses of the present arrangement, the articles described may be positioned in any desired orientation and/or may be utilized in any desired position and/or orientation. Such terms of position and/or orientation should be understood as being for convenience only, and not as limiting of the invention as claimed.

The term battery is used herein to refer to an electrochemical device comprising one or more electro-chemical cells and/or fuel cells, and so a battery may include a single cell or plural cells, whether as individual units or as a packaged unit. A battery is one example of a type of an electrical power source suitable for a portable device.

While the present invention has been described in terms of the foregoing example embodiments, variations within the scope and spirit of the present invention as defined by the claims following will be apparent to those skilled in the art. For example, while the preferred embodiment of light 10 is shown to have a battery compartment 302 that accommodates two different single batteries, light 10 may have a battery compartment 302 that accommodates other than two different single batteries.

By way of example, housing portion 140 and battery compartment 302 therein could be extended in length, e.g., at the end 142 at which cap 150 attaches, or at the opposite end, or at both ends, so as to accept therein two different sets of two or more batteries in series, e.g., two AA cells and two CR123 cells or three AA cells and three CR123 cells, and so forth. Further, sleeve 320 and battery ring 156 could have stepped or tapered diameter central cavities for receiving batteries of plural different diameters, e.g., a size CR123 battery or a size AA battery or a size AAA battery, with spring contacts 154, 324 expanding and being compressed according to the length of the battery. Still further, both of the foregoing alternatives could be employed so that light 10 could accept more than two different sets of more than two different batteries, e.g., two or more CR123 batteries in series or two or more AA batteries in series or two or more AAA batteries in series, and so forth. Further, two or more batteries could be placed side-by-side in a compartment according to the disclosed arrangement wherein two or more compartments as described are placed side-by-side in the housing for receiving the side-by-side batteries. While a wall may be present between the adjacent compartments and the batteries therein, a wall is not necessary and there may be an opening between the two adjacent compartments consistent with the two compartments both receiving respective batteries of the type having the larger diameter.

In example light 10 herein the contacts 154, 324 at either end of battery compartment 302 are movable longitudinally for making contact with the terminals of a battery therein, however, it is satisfactory that only one of contacts 154, 324 be movable to accommodate the different lengths of different batteries and/or that both of contacts 154, 324 be at the same end of compartment 302, e.g., where a battery or battery pack has both of its terminals at one end thereof.

The different batteries accommodated may have cylindrical configurations as described or may have other configurations, e.g., a rectangular configuration, as do typical 9-volt alkaline batteries and various batteries for cellular telephones, MP3 players and other portable devices.

While circuitry 400 may control LED current as described, LED current may be controlled in any other suitable manner, e.g., by controlling the operation of selection transistors Q1-Q3, U1A in an analog manner either being OFF when not selected or being controlled ON responsive to the current sensed by a resistor, R1, R3 with the power conditioner voltage Vo being a fixed voltage.

Further, a light source 230 for a portable light 10 could include a greater number or a lesser number of distinct light sources, e.g., any one or more light sources 232, 236, and each light source 232, 236 may comprise one or more light producing elements, e.g., LEDs and/or incandescent or other lamps, as may be desired, and the various parts of the circuitry described may be replicated therefor.

Protection against insertion of a battery in an incorrect orientation, which would cause the battery voltage to be applied with the reverse of the intended polarity, may be provided by a physical or mechanical arrangement, e.g., by a polarity protector ring 322 as described, or may be provided electronically, e.g., by a series diode, preferably a low forward voltage device such as a Schottky diode, connected in series with the battery, and the polarity ring 322 may be eliminated. Further, both physical and electronic protection against reverse battery voltage polarity could be provided.

Each of the U.S. Provisional applications, U.S. patent applications, and/or U.S. patents identified herein are hereby incorporated herein by reference in their entirety, for any purpose and for all purposes irrespective of how it may be referred to herein.

Finally, numerical values stated are typical or example values, are not limiting values, and do not preclude substantially larger and/or substantially smaller values. Values in any given embodiment may be substantially larger and/or may be substantially smaller than the example or typical values stated.

What is claimed is:

1. A portable light comprising:

a light source for producing light when energized;

a switch for controlling energization of said light source;

a light housing supporting said light source and said switch, said light housing having a cylindrical compartment for receiving batteries of different sizes, wherein the cylindrical compartment has a relatively larger diameter in a central region thereof and has a relatively smaller diameter at least at one end thereof;

a single first electrical contact and a single second electrical contact disposed at opposite ends of the cylindrical compartment for making electrical connection to a battery when a battery is received therein, wherein the battery may be of a relatively larger diameter and a relatively shorter length or may be of a relatively smaller diameter and a relatively longer length, and wherein the battery connects to the single first electrical contact and to the single second contact regardless of the diameter and/or length of the battery; and the cylindrical compartment of said light housing having a cylindrical section defining the relatively smaller diameter at least at one end thereof, wherein the diameter of said cylindrical section is smaller than the diameter of a battery of a relatively larger diameter and is larger than the diameter of a battery of a relatively smaller diameter.

2. The portable light of claim 1 wherein said light housing comprises:
  a base housing having the cylindrical compartment therein and having an opening; and
  a cap for removably covering the opening of said base housing for accessing the cylindrical compartment for placing a battery therein and for removing a battery therefrom,
  wherein said base housing includes one of said first and second electrical contacts in the cylindrical compartment thereof and wherein said cap includes the other of said first and second electrical contacts.

3. The portable light of claim 1 wherein at least one of said first and second electrical contacts comprises:
  a spring contact for extending and compressing for contacting batteries of the relatively shorter length and of the relatively longer length; or
  a spring contact disposed in said sleeve for extending and compressing for contacting batteries of the relatively shorter length and of the relatively longer length.

4. The portable light of claim 3 further comprising:
  a polarity ring of an insulating material and having an opening of a size permitting a battery terminal of one polarity to contact one of said first and second electrical contacts and blocking a battery terminal of the opposite polarity from contacting the one of said first and second electrical contacts.

5. The portable light of claim 1 further comprising:
  an electronic circuit for receiving electrical power at voltages produced by batteries of different types and providing therefrom electrical power at a voltage compatible with said light source; or
  an electronic circuit responsive to a battery being placed in the compartment of said light housing for determining the type of the battery and changing an operating condition of said light source responsive thereto; or
  an electronic circuit for receiving electrical power at voltages produced by batteries of different types and providing therefrom electrical power at a voltage compatible with said light source and responsive to a battery being placed in the compartment of said light housing for determining the type of the battery and changing an operating condition of said light source responsive thereto.

6. The portable light of claim 1 wherein the cylindrical section of the cylindrical compartment of said housing includes:
  a cylindrical sleeve disposed in the cylindrical compartment of said housing; or
  a cylindrical ring disposed in a cap for covering an openable end of the cylindrical compartment of said housing; or
  a cylindrical sleeve disposed in the cylindrical compartment of said housing and a ring disposed in a cap for covering an openable end of the cylindrical compartment of said housing.

7. A portable device comprising:
  an operative element for operating when energized;
  a switch for controlling energization of said operative element;
  a housing supporting said operative element and said switch, said housing having a cylindrical compartment for receiving batteries of different sizes, wherein the cylindrical compartment has a relatively larger diameter in a central region thereof and has a relatively smaller diameter at least at one end thereof;
  a single first electrical contact and a single second electrical contact disposed at opposite ends of the cylindrical compartment for making electrical connection to a battery when a battery is received therein, wherein the battery may be of a relatively larger diameter and a relatively shorter length or may be of a relatively smaller diameter and a relatively longer length, and wherein the battery connects to the single first electrical contact and to the single second contact regardless of the diameter and/or length of the battery; and
  the cylindrical compartment of said light housing having a cylindrical section defining the relatively smaller diameter at least at one end thereof, wherein the diameter of said cylindrical section is smaller than the diameter of a battery of a relatively larger diameter and is larger than the diameter of a battery of a relatively smaller diameter.

8. The portable device of claim 7 wherein said housing comprises:
  a base housing having the cylindrical compartment therein and having an opening; and
  a cap for removably covering the opening of said base housing for accessing the cylindrical compartment for placing a battery therein and for removing a battery therefrom,
  wherein said base housing includes one of said first and second electrical contacts in the cylindrical compartment thereof and wherein said cap includes the other of said first and second electrical contacts.

9. The portable device of claim 7 wherein at least one of said first and second electrical contacts comprises:
  a spring contact for extending and compressing for contacting batteries of the relatively shorter length and of the relatively longer length; or
  a spring contact disposed in said sleeve for extending and compressing for contacting batteries of the relatively shorter length and of the relatively longer length.

10. The portable device of claim 9 further comprising:
  a polarity ring of an insulating material and having an opening of a size permitting a battery terminal of one polarity to contact one of said first and second electrical contacts and blocking a battery terminal of the opposite polarity from contacting the one of said first and second electrical contacts.

11. The portable device of claim 7 further comprising:
  an electronic circuit for receiving electrical power at voltages produced by batteries of different types and providing therefrom electrical power at a voltage compatible with said operative element; or
  an electronic circuit responsive to a battery being placed in the compartment of said housing for determining the type of the battery and changing an operating condition of said operative element responsive thereto; or
  an electronic circuit for receiving electrical power at voltages produced by batteries of different types and providing therefrom electrical power at a voltage compatible with said light source and responsive to a battery being placed in the compartment of said housing for determining the type of the battery and changing an operating condition of said operative element responsive thereto.

12. The portable device of claim 7 wherein said portable device includes a portable light, said operative element includes a light source for producing light when energized, said switch is for controlling energization of said light source;

and said housing supporting said operative element and said switch includes a light housing supporting said light source and said switch.

13. The portable light of claim 7 wherein the cylindrical section of the cylindrical compartment of said housing includes:
a cylindrical sleeve disposed in the cylindrical compartment of said housing; or
a cylindrical ring disposed in a cap for covering an openable end of the cylindrical compartment of said housing; or
a cylindrical sleeve disposed in the cylindrical compartment of said housing and a ring disposed in a cap for covering an openable end of the cylindrical compartment of said housing.

14. A portable light comprising:
a light source for producing light when energized;
a switch for controlling energization of said light source;
a light housing supporting said light source and said switch, said light housing having a compartment for receiving batteries of different sizes, wherein said compartment has a relatively larger transverse dimension in one region thereof for receiving a battery having a corresponding relatively larger transverse dimension and has a relatively smaller transverse dimension at least at one end thereof for receiving a battery having a corresponding relatively smaller transverse dimension;
a single first electrical contact and a single second electrical contact disposed in the compartment for making electrical connection to the terminals of a battery when a battery is received therein, wherein at least one of said first and second electrical contacts is movable within the compartment for making electrical connection to the terminals of batteries having a relatively shorter length and a relatively longer length, and wherein the battery terminals connect to the single first electrical contact and to the single second contact regardless of the length and/or transverse dimension of the battery; and
the compartment of said light housing having a section defining the relatively smaller transverse dimension at least at one end thereof, wherein the transverse dimension of said section is smaller than the transverse dimension of a battery of a relatively larger transverse dimension and is larger than the transverse dimension of a battery of a relatively smaller transverse dimension.

15. The portable light of claim 14 wherein said light housing comprises:
a base housing having the compartment therein and having an opening; and
a cap for removably covering the opening of said base housing for accessing the compartment for placing a battery therein and for removing a battery therefrom, wherein said base housing includes one of said first and second electrical contacts in the compartment thereof and wherein said cap includes the other of said first and second electrical contacts.

16. The portable light of claim 14 wherein at least one of said first and second electrical contacts comprises:
a spring contact for extending and compressing for contacting batteries of the relatively shorter length and of the relatively longer length; or
a spring contact disposed in said sleeve for extending and compressing for contacting batteries of the relatively shorter length and of the relatively longer length.

17. The portable light of claim 16 further comprising:
a polarity ring of an insulating material and having an opening of a size permitting a battery terminal of one polarity to contact one of said first and second electrical contacts and blocking a battery terminal of the opposite polarity from contacting the one of said first and second electrical contacts.

18. The portable light of claim 14 further comprising:
an electronic circuit for receiving electrical power at voltages produced by batteries of different types and providing therefrom electrical power at a voltage compatible with said light source; or
an electronic circuit responsive to a battery being placed in the compartment of said light housing for determining the type of the battery and changing an operating condition of said light source responsive thereto; or
an electronic circuit for receiving electrical power at voltages produced by batteries of different types and providing therefrom electrical power at a voltage compatible with said light source and responsive to a battery being placed in the compartment of said light housing for determining the type of the battery and changing an operating condition of said light source responsive thereto.

19. The portable light of claim 14 wherein the section of the compartment of said housing includes:
a sleeve disposed in the compartment of said housing; or
a ring disposed in a cap for covering an openable end of the compartment of said housing; or
a sleeve disposed in the compartment of said housing and a ring disposed in a cap for covering an openable end of the compartment of said housing.

20. A portable device comprising:
an operative element for operating when energized;
a switch for controlling energization of said operative element;
a housing supporting said operative element and said switch, said housing having a compartment for receiving batteries of different sizes, wherein the compartment has a relatively larger transverse dimension in one region thereof for receiving a battery having a corresponding relatively larger transverse dimension and has a relatively smaller transverse dimension at least at one end thereof for receiving a battery having a corresponding relatively smaller transverse dimension;
a single first electrical contact and a single second electrical contact disposed in the compartment for making electrical connection to the terminals of a battery when a battery is received therein, wherein at least one of said first and second electrical contacts is movable within the compartment for making electrical connection to the terminals of batteries having a relatively shorter length and a relatively longer length, and wherein the battery terminals connect to the single first electrical contact and to the single second contact regardless of the length and/or transverse dimension of the battery; and
the compartment of said light housing having a section defining the relatively smaller transverse dimension at least at one end thereof, wherein the transverse dimension of said section is smaller than the transverse dimension of a battery of a relatively larger transverse dimension and is larger than the transverse dimension of a battery of a relatively smaller transverse dimension.

21. The portable device of claim 20 wherein said housing comprises:
a base housing having the compartment therein and having an opening; and
a cap for removably covering the opening of said base housing for accessing the compartment for placing a battery therein and for removing a battery therefrom, wherein said base housing includes one of said first and second electrical contacts in the compartment thereof and wherein said cap includes the other of said first and second electrical contacts.

22. The portable device of claim 20 wherein at least one of said first and second electrical contacts comprises:
- a spring contact for extending and compressing for contacting batteries of the relatively shorter length and of the relatively longer length; or
- a spring contact disposed in said sleeve for extending and compressing for contacting batteries of the relatively shorter length and of the relatively longer length.

23. The portable device of claim 22 further comprising:
- a polarity ring of an insulating material and having an opening of a size permitting a battery terminal of one polarity to contact one of said first and second electrical contacts and blocking a battery terminal of the opposite polarity from contacting the one of said first and second electrical contacts.

24. The portable device of claim 20 further comprising:
- an electronic circuit for receiving electrical power at voltages produced by batteries of different types and providing therefrom electrical power at a voltage compatible with said operative element; or
- an electronic circuit responsive to a battery being placed in the compartment of said housing for determining the type of the battery and changing an operating condition of said operative element responsive thereto; or
- an electronic circuit for receiving electrical power at voltages produced by batteries of different types and providing therefrom electrical power at a voltage compatible with said light source and responsive to a battery being placed in the compartment of said housing for determining the type of the battery and changing an operating condition of said operative element responsive thereto.

25. The portable device of claim 20 wherein said portable device includes a portable light, said operative element includes a light source for producing light when energized, said switch is for controlling energization of said light source; and said housing supporting said operative element and said switch includes a light housing supporting said light source and said switch.

26. The portable light of claim 20 wherein the section of the compartment of said housing includes:
- a sleeve disposed in the compartment of said housing; or
- a ring disposed in a cap for covering an openable end of the compartment of said housing; or
- a sleeve disposed in the compartment of said housing and a ring disposed in a cap for covering an openable end of the compartment of said housing.

* * * * *